(12) United States Patent
Williamson et al.

(10) Patent No.: US 8,305,559 B2
(45) Date of Patent: Nov. 6, 2012

(54) EXPOSURE APPARATUS THAT UTILIZES MULTIPLE MASKS

(75) Inventors: David M. Williamson, Tucson, AZ (US); Shane R. Palmer, Burlingame, CA (US)

(73) Assignee: Nikon Corporation, Tokyo (JP)

( * ) Notice: Subject to any disclaimer, the term of this patent is extended or adjusted under 35 U.S.C. 154(b) by 616 days.

(21) Appl. No.: 12/481,539

(22) Filed: Jun. 9, 2009

(65) Prior Publication Data
US 2009/0316131 A1  Dec. 24, 2009

Related U.S. Application Data

(60) Provisional application No. 61/060,411, filed on Jun. 10, 2008, provisional application No. 61/078,251, filed on Jul. 3, 2008, provisional application No. 61/078,254, filed on Jul. 3, 2008, provisional application No. 61/104,477, filed on Oct. 10, 2008.

(51) Int. Cl.
*G03B 27/54* (2006.01)
*G03B 27/42* (2006.01)

(52) U.S. Cl. ............................................ 355/67; 355/53

(58) Field of Classification Search ............. 355/53, 355/55, 75; 250/548; 356/399–401
See application file for complete search history.

(56) References Cited

U.S. PATENT DOCUMENTS

| | | | |
|---|---|---|---|
| 5,329,335 A | 7/1994 | Wada et al. | |
| 5,369,464 A | 11/1994 | Kamon | |
| 5,863,677 A | 1/1999 | Nakao | |
| 6,611,316 B2 | 8/2003 | Sewell | |
| 6,778,257 B2 | 8/2004 | Bleeker et al. | |
| 6,819,405 B2 | 11/2004 | Mulkens et al. | |
| 6,967,713 B2 | 11/2005 | McCullough et al. | |
| 7,094,506 B2 | 8/2006 | Van Buel | |
| 7,932,994 B2 * | 4/2011 | Nagasaka | 355/53 |
| 2007/0013885 A1 | 1/2007 | Loopstra et al. | |
| 2007/0013890 A1 | 1/2007 | Loopstra et al. | |
| 2007/0013893 A1 | 1/2007 | Loopstra et al. | |
| 2007/0013894 A1 | 1/2007 | Loopstra | |
| 2007/0153247 A1 | 7/2007 | Nagasaka | |
| 2007/0216884 A1* | 9/2007 | Nagasaka | 355/53 |
| 2007/0242244 A1 | 10/2007 | Nagasaka | |

(Continued)

FOREIGN PATENT DOCUMENTS

EP   2009677 A1   12/2008

(Continued)

*Primary Examiner* — Hung Henry Nguyen
(74) *Attorney, Agent, or Firm* — Roeder & Broder LLP

(57) ABSTRACT

An exposure apparatus (10) for transferring a first mask pattern (29A) from a first mask (26A) and a second mask pattern (29B) from a second mask (26B) to a substrate (28) includes a first mask stage assembly (18A), a second mask stage assembly (18B), an illumination system (14A), a substrate stage assembly (20), and an optical assembly (16). The first mask stage assembly (18A) positions the first mask (26A). The second mask stage assembly (18B) positions the second mask (26B). The illumination system (14A) selectively generates a first illumination beam (32A) that is directed at the first mask (26A) to generate a first pattern beam (38A), and a second illumination beam (32B) that is directed at the second mask (26B) to generate a second pattern beam (38B). The substrate stage assembly (20) positions the substrate (28). The optical assembly (16) can include a first optical inlet (40A) that receives the first pattern beam (38A), a spaced apart second optical inlet (40B) that receives the second pattern beam (38B), and an optical outlet (40C) that directs and focuses the first pattern beam (38A) and the second pattern beam (38B) onto the substrate (28).

32 Claims, 18 Drawing Sheets

U.S. PATENT DOCUMENTS

| | | |
|---|---|---|
| 2007/0242249 A1 | 10/2007 | Shibazaki et al. |
| 2007/0242255 A1 | 10/2007 | Nagasaka |
| 2007/0258077 A1 | 11/2007 | Tanaka et al. |
| 2007/0273854 A1 | 11/2007 | Nagasaka |
| 2007/0279606 A1 | 12/2007 | Nagasaka |
| 2008/0246932 A1 | 10/2008 | Shigematsu |
| 2008/0259440 A1* | 10/2008 | Omura ......................... 359/362 |
| 2009/0040490 A1 | 2/2009 | Shigematsu et al. |
| 2009/0086186 A1 | 4/2009 | Muramatsu et al. |
| 2009/0135396 A1 | 5/2009 | Mizuno et al. |

FOREIGN PATENT DOCUMENTS

| | | |
|---|---|---|
| EP | 2040283 A1 | 3/2009 |
| EP | 2040284 A1 | 3/2009 |
| JP | 08-298239 | 11/1996 |
| JP | H09-7933 A | 1/1997 |
| JP | 200021742 A | 1/2000 |
| JP | 200021748 A | 1/2000 |
| JP | 2001297976 A | 10/2001 |
| JP | 3531297 B2 | 3/2004 |
| JP | 20006318954 A | 11/2006 |
| JP | 2007281169 A | 10/2007 |
| JP | 2007299918 A | 11/2007 |
| JP | 200842027 A | 2/2008 |
| JP | 2008103425 A | 5/2008 |
| WO | 2007119466 A1 | 10/2007 |
| WO | 2008007632 A1 | 1/2008 |
| WO | 2008007633 A1 | 1/2008 |
| WO | 2008004654 A1 | 10/2008 |
| WO | 2009052925 A1 | 4/2009 |

\* cited by examiner

EXPOSURE APPARATUS THAT UTILIZES MULTIPLE MASKS

RELATED APPLICATIONS

This application claims priority on U.S. Provisional Application Ser. No. 61/060,411, filed Jun. 10, 2008 and entitled "SYSTEM ARCHITECTURE FOR ACHIEVING HIGHER SCANNER THROUGHPUT"; on U.S. Provisional Application Ser. No. 61/078,251, filed Jul. 3, 2008 and entitled "HIGH NA CATADIOPTRIC PROJECTION OPTICS FOR IMAGING TWO RETICLES ONTO ONE WAFER"; on U.S. Provisional Application Ser. No. 61/078,254 filed on Jul. 3, 2008 and entitled "X-SCANNING EXPOSURE SYSTEM WITH CONTINUOUS EXPOSURE"; and on U.S. Provisional Application Ser. No. 61/104,477 filed on Oct. 10, 2008. As far as is permitted, the contents of U.S. Provisional Application Ser. Nos. 61/060,411, 61/078,251, 61/078,254 and 61/104,477 are incorporated herein by reference.

BACKGROUND

Exposure apparatuses for semiconductor processing are commonly used to transfer images from a reticle onto a semiconductor wafer during semiconductor processing. A typical exposure apparatus includes an illumination source, a mask stage assembly that positions a reticle, an optical assembly, a wafer stage assembly that positions a semiconductor wafer, a measurement system, and a control system. Typically, the wafer is divided into a plurality of rectangular shaped integrated circuits.

There are two kinds of exposure apparatuses that are generally known and currently used. The first kind is commonly referred to as a Stepper lithography system. In a Stepper lithography system, the reticle is fixed (except for slight corrections in position) and the wafer stage assembly moves the wafer to fixed chip sites where the illumination source directs an illumination beam at an entire reticle pattern on the reticle. After the exposure, the wafer is moved ("stepped") to the next site for subsequent exposure. In this type of system, the throughput of the apparatus is largely governed by how quickly the wafer stage assembly accelerates and decelerates the wafer between exposures during movement between sites.

The second kind of system is commonly referred to as a Scanner lithography system. In a Scanner lithography system, the mask stage assembly moves the reticle concurrently with the wafer stage assembly moving the wafer during the exposure process. With this system, the illumination beam is slit shaped and illuminates only a portion of the reticle pattern on the reticle. With this design, only a portion of the reticle pattern is exposed and transferred to the site on the wafer at a given moment, and the entire reticle is exposed and transferred to the site on the wafer over time as the reticle pattern is moved through the exposure slit. After the entire site is scanned, (i) the wafer stage assembly decelerates the wafer, steps the wafer, and subsequently accelerates the wafer in the opposite direction during movement of the wafer to the next site, and (ii) the mask stage assembly decelerates the reticle and subsequently accelerates the reticle in the opposite direction so that the reticle is moving in the opposite direction during the exposure of the next site. In this type of system, there is one stepping motion for every scanning motion. Thus, throughput of the apparatus is largely governed by how quickly the wafer stage assembly accelerates and decelerates the wafer, and how quickly the mask stage assembly accelerates and decelerates the reticle.

There is a never ending search to increase the throughput in terms of exposures per hour for the exposure apparatuses. With the current exposure apparatuses, assuming that there is sufficient light to adequately expose the wafer, in order to gain higher throughput, it is necessary to move the wafer and/or reticle at higher speeds, and accelerations. Unfortunately, it is not always easy to merely increase the velocities and accelerations of the wafer and the reticle.

SUMMARY

The present invention is directed to an exposure apparatus for transferring a first mask pattern from a first mask and a second mask pattern from a second mask to a substrate. In certain embodiments, the substrate includes a first site and a second site that are aligned along a scan axis. In one embodiment, the exposure apparatus includes a first mask stage assembly, a second mask stage assembly, an illumination system, a substrate stage assembly, and an optical assembly. The first mask stage assembly positions the first mask. The second mask stage assembly positions the second mask. The illumination system selectively generates a first illumination beam that is directed at the first mask to generate a first pattern beam, and a second illumination beam that is directed at the second mask to generate a second pattern beam. The substrate stage assembly positions the substrate. The optical assembly directs and focuses the first pattern beam and the second pattern beam onto the substrate.

With the present invention, the exposure apparatus utilizes multiple masks to transfer images to the substrate. With this design, in certain embodiments, at least two adjacent sites on the substrate can be sequentially exposed without stopping the substrate and without changing the movement direction of substrate. Stated in another fashion, at least two sites can be scanned without stepping the substrate. This allows for higher overall throughput for the exposure apparatus.

In certain embodiments, the optical assembly includes a first optical inlet that receives the first pattern beam, and a spaced apart second optical inlet that receives the second pattern beam. Further, the optical assembly can include an optical outlet that directs and focuses both the first pattern beam and the second pattern beam at the substrate. Additionally, in some embodiments, the optical assembly further includes a field of view having a first used field and a spaced apart second used field. In such embodiments, the first pattern beam exits the optical outlet at the first used field, and the second pattern beam exits the optical outlet at the second used field. Still further, the field of view can include a field axis and the used fields can be positioned on opposite sides of the field axis.

In some embodiments, the exposure apparatus further comprises a control system that controls the first mask stage assembly, the second mask stage assembly, the illumination system, and the substrate stage assembly. In one such embodiment, the control system causes the first mask pattern to be transferred to the first site and the second mask pattern to be transferred to the second site in sequential order. In another such embodiment, the control system causes the first mask pattern to be transferred to the first site and the second mask pattern to be transferred to the second site while the substrate is being moved at a substantially constant velocity along the scan axis. In still another such embodiment, the control system causes the first pattern beam to be directed at the first site and the second pattern beam to be directed at the second site at approximately the same time. In yet another such embodiment, the control system causes the first pattern beam to be directed at the first site and the second pattern beam to be directed at the second site at the same time.

In one embodiment, the illumination system is designed so that the first illumination beam has a first polarization and the second illumination beam has a second polarization that is different than the first polarization. In this embodiment, the first mask pattern can include features that are aligned along a first axis, and the second mask pattern can include features that are aligned along a second axis. With this design, the polarization of the first illumination beam can be optimized to illuminate the first mask pattern, and the second illumination beam can be optimized to illuminate the second mask pattern. Further, the first mask can be designed to include the features that are best illuminated by an illumination beam having the first polarization, and the second mask can be designed to include the features that are best illuminated by an illumination beam having a second polarization.

In certain embodiments, the exposure apparatus further comprises a third mask stage assembly that positions a third mask. In such embodiments, the illumination system selectively generates a third illumination beam that is directed at the third mask to generate a third pattern beam, and the optical assembly focuses the third pattern beam onto the substrate. In one such embodiment, the optical assembly includes a first optical inlet that receives the first pattern beam and the third pattern beam, and a spaced apart second optical inlet that receives the second pattern beam. Additionally, in such embodiments, the exposure apparatus may further comprise a control system that controls the first mask stage assembly, the second mask stage assembly, the third mask stage assembly, the illumination system, and the substrate stage assembly so that the first mask pattern is transferred to the first site, the second mask pattern is transferred to the second site, and the third mask pattern is transferred to the third site while the substrate is being moved at a substantially constant velocity along the scan axis.

The present invention is further directed to a method for transferring a first mask pattern from a first mask and a second mask pattern from a second mask to a substrate, a method for making an exposure apparatus, and a method of manufacturing a wafer with the exposure apparatus.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
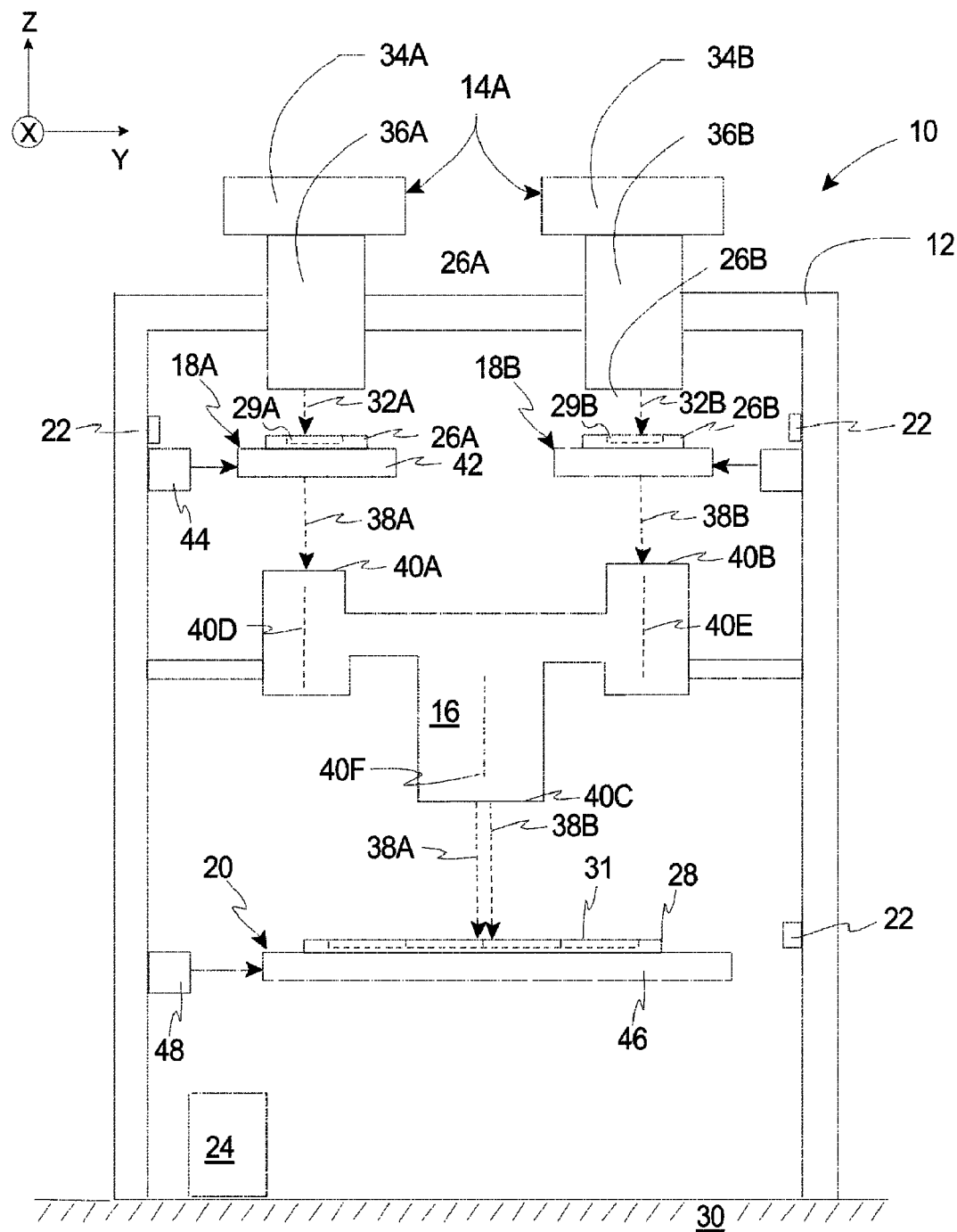
FIG. 1A is a schematic illustration of an exposure apparatus having features of the present invention.

FIG. 1A is a schematic illustration of an exposure apparatus 10 having features of the present invention. The design of the components of the exposure apparatus 10 can be varied to suit the design requirements of the exposure apparatus 10. In FIG. 1A, the exposure apparatus 10 includes an apparatus frame 12, an illumination system 14A, an projection optical assembly 16, a first mask stage assembly 18A, a second mask stage assembly 18B, a substrate stage assembly 20, a measurement system 22, and a control system 24.

In certain embodiments, the exposure apparatus 10 utilizes multiple masks 26A, 26B to transfer images to a substrate 28 that includes a plurality of sites 31 (illustrated in phantom in FIG. 1A). With this design, in certain embodiments, at least two adjacent sites 31 on the substrate 28 can be sequentially exposed without stopping the substrate 28 and without changing the movement direction of substrate 28. Stated in another fashion, at least two sites 31 can be scanned without stepping the substrate 28. This allows for higher overall throughput for the exposure apparatus 10.

There are a number of different types of exposure apparatuses 10. For example, the exposure apparatus 10 can be used as a scanning type photolithography system (i) that first exposes a first mask pattern 29A from the first mask 26A onto one of the sites 31 of the substrate 28 while the first mask 26A and the substrate 28 are moving synchronously, and (ii) that subsequently exposes a second mask pattern 29B from the second mask 26B onto an adjacent site 31 on the substrate 28 while the second mask 26B and the substrate 28 are moving synchronously. Alternatively, exposure apparatus 10 can be used to scan both the first mask pattern 29A and the second mask pattern 29B onto the same site 31.

Still alternatively, the exposure apparatus 10 can be a step-and-repeat type photolithography system that exposes the first mask 26A to one or more of the sites 31 in a step-and-repeat fashion, and subsequently exposes the second mask 26B to one or more of the sites 31 in a step-and-repeat fashion.

The exposure apparatus 10 discussed herein is particularly useful as a photolithography system for semiconductor manufacturing that transfers features from two reticles (the masks 26A, 26B) to a wafer (the substrate 28). However, the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

A discussion regarding another type of exposure apparatus is disclosed in concurrently filed application Ser. No. 12/481,326, filed on Jun. 9, 2009 and entitled "EXPOSURE APPARATUS WITH SCANNING ILLUMINATION BEAM", which is assigned to the assignee of the present invention, and is incorporated by reference herein as far as permitted.

It should be noted that a number of Figures include an orientation system that illustrates an X axis, a Y axis that is orthogonal to the X axis, and a Z axis that is orthogonal to the X and Y axes. Further, any of these axes can also be referred to as the first, second, and/or third axes.

The apparatus frame 12 is rigid and supports the components of the exposure apparatus 10. For example, the apparatus frame 12 illustrated in FIG. 1A supports the mask stage assemblies 18A, 18B, the projection optical assembly 16, the illumination system 14A, and the substrate stage assembly 20. In FIG. 1A, the apparatus frame 12 mounts to a mounting base 30, e.g., the ground, a base, or a floor, or some other supporting structure.

The illumination system 14A generates a first illumination beam 32A (irradiation) of light energy that is selectively directed at the first mask 26A, and a second illumination beam 32B (irradiation) of light energy that is selectively directed at the second mask 26B. In certain embodiments, the illumination system 14A generates both illumination beams 32A, 32B at the same time. Alternatively, in certain designs, the illumination system 14A will sequentially generate the illumination beams 32A, 32B during the sequential exposure of the sites 31.

Figure 1B:
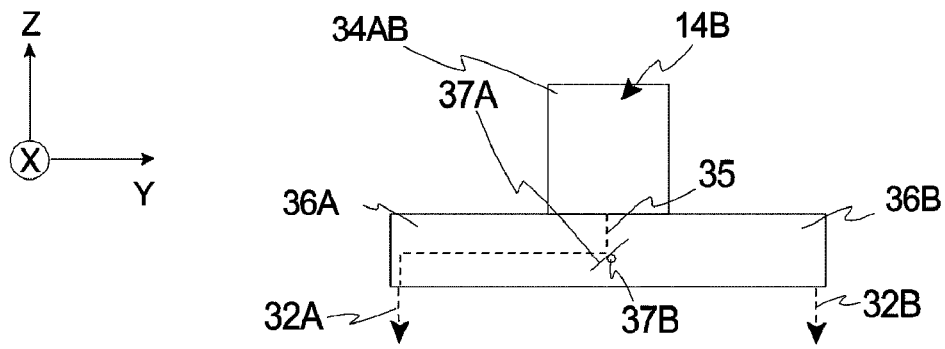
FIG. 1B is a schematic illustration of a portion of another embodiment of an exposure apparatus having features of the present invention.
Figure 1C:
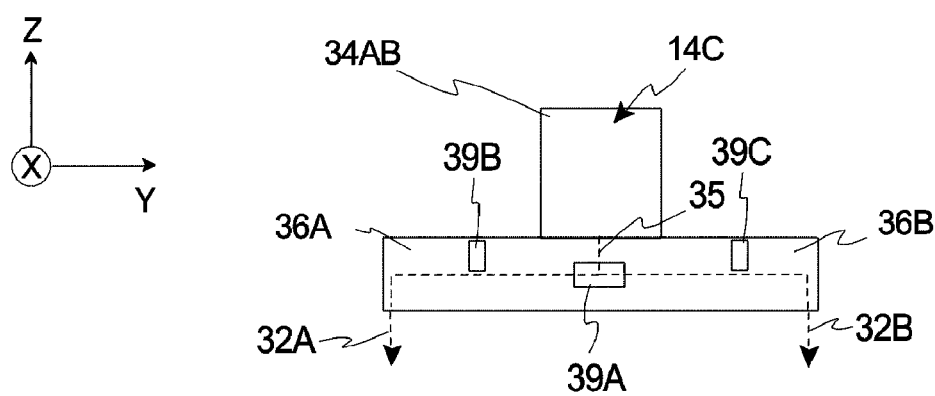
FIG. 1C is a schematic illustration of a portion of yet another embodiment of an exposure apparatus having features of the present invention.

In one embodiment, the illumination system 14A includes (i) a first illumination source 34A that emits the first illumination beam 32A; (ii) a first illumination optical assembly 36A that guides the first illumination beam 32A from the first illumination source 34A to near the first mask 26A; (iii) a second illumination source 34B that emits the second illumination beam 32B; and (iv) a second illumination optical assembly 36B that guides the second illumination beam 32B from the second illumination source 34B to near the second mask 26B. Alternatively, as illustrated in FIGS. 1B and 1C and described below, the illumination system 14A can be designed with a single illumination source that generates an illumination beam that is split or selectively redirected to create the multiple separate illumination beams 32A, 32B.

As provided herein, one or both of the illumination sources 34A, 34B can be a g-line source (436 nm), an i-line source (365 nm), a KrF excimer laser (248 nm), an ArF excimer laser (193 nm), a $F_2$ laser (157 nm), or an EUV source (13.5 nm). Alternatively, either or both of the illumination sources 34A, 34B can generate charged particle beams such as an x-ray or an electron beam.

In FIG. 1A, the first illumination source 34A is illustrated as being supported above the first mask stage assembly 18A, and the second illumination source 34B is illustrated as being supported above the second mask stage assembly 18B. Alternatively, the illumination sources 34A, 34B can be positioned at another location.

The first illumination beam 32A illuminates the first mask 26A to generate a first pattern beam 38A (e.g. images from the first mask 26A) that exposes the substrate 28. Similarly, the second illumination beam 32B illuminates the second mask 26B to generate a second pattern beam 38B (e.g. images from the second mask 26B) that exposes the substrate 28.

In FIG. 1A, the first mask 26A is at least partly transparent, and the first illumination beam 32A is transmitted through a portion of the first mask 26A; and the second mask 26B is at least partly transparent, and the second illumination beam 32B is transmitted through a portion of the second mask 26B. Alternatively, one or both of the masks 26A, 26B can be reflective, and the respective illumination beam 32A, 32B can be directed at and reflected off of the corresponding mask 26A, 26B.

The projection optical assembly 16 projects and/or focuses the first pattern beam 38A and the second pattern beam 38B onto the substrate 28. Depending upon the design of the exposure apparatus 10, the projection optical assembly 16 can magnify or reduce the pattern beams 38A, 38B. In one non-exclusive embodiment, the projection optical assembly 16 reduces the size of the pattern beams 38A, 38B by a factor of four.

In the embodiment illustrated in FIG. 1A, the projection optical assembly 16 includes (i) a first optical inlet 40A that receives the first pattern beam 38A, (ii) a second optical inlet 40B that receives the second pattern beam 38B, and (iii) an optical outlet 40C that directs both pattern beams 38A, 38B at the substrate 28. Further, in this embodiment, (i) the first optical inlet 40A includes a first inlet axis 40D, (ii) the second optical inlet 40B includes a second inlet axis 40E, and (iii) the optical outlet 40C includes an outlet axis 40F. The projection optical assembly 16 is described in more detail below.

The first mask stage assembly 18A holds and positions the first mask 26A relative to the projection optical assembly 16 and the substrate 28. Similarly, the second mask stage assembly 18B holds and positions the second mask 26B relative to the projection optical assembly 16 and the substrate 28. In this embodiment, the first mask stage assembly 18A positions the first mask 26A independently of the second mask stage assembly 18B positioning the second mask 26B.

Each mask stage assembly 18A, 18B can include (i) a mask stage 42 that includes a chuck (not shown) that retains the respective mask 26A, 26B, and (ii) a mask stage mover assembly 44 that moves and positions the respective mask stage 42 and mask 26A, 26B. For example, the mask stage mover assembly 44 can move the mask stage 42 and the mask 26A, 26B along the Y axis, along the X axis, and about the Z axis. Alternatively, for example, the mask stage mover assembly 44 can be designed to move the mask stage 42 and the mask 26A, 26B with more than three degrees of freedom, or less than three degrees of freedom. For example, the mask stage mover assembly 44 can include one or more linear motors, rotary motors, planar motors, voice coil actuators, or other type of actuators.

Somewhat similarly, the substrate stage assembly 20 holds and positions the substrate 28 with respect to the pattern beams 38A, 38B. The substrate stage assembly 20 can include (i) a substrate stage 46 that includes a chuck (not shown) that holds the substrate 28, and (ii) a substrate stage mover assembly 48 that moves and positions the substrate stage 46 and the substrate 28. For example, the substrate stage mover assembly 48 can move the substrate stage 46 and the substrate 28 along the Y axis, along the X axis, and about the Z axis. Alternatively, for example, the substrate stage mover assembly 48 can be designed to move the substrate stage 46 and the substrate 28 with more than three degrees of freedom, or less than three degrees of freedom. For example, the substrate stage mover assembly 48 can include one or more linear motors, rotary motors, planar motors, voice coil actuators, or other type of actuators.

The measurement system 22 monitors movement of the masks 26A, 26B and the substrate 28 relative to the optical assembly 20 or some other reference. With this information, the control system 24 can control the mask stage assemblies 18A, 18B to precisely position the masks 26A, 26B and the substrate stage assembly 20 to precisely position the substrate 28. For example, the measurement system 22 can utilize multiple laser interferometers, encoders, and/or other measuring devices.

The control system 24 is electrically connected to the illumination system 14A, the mask stage assemblies 18A, 18B, the substrate stage assembly 20, and the measurement system 22. The control system 24 receives information from the measurement system 22 and controls the stage assemblies 18A, 18B, 20 to precisely position the masks 26A, 26B and the substrate 28. Further, the control system 24 can control the operation of the illumination system 14A to selectively and independently generate the illumination beams 32A, 32B. The control system 24 can include one or more processors and circuits. In FIG. 1A, the control system 24 is illustrated as a single unit. It should be noted that the control system 24 can be designed with multiple, spaced apart controllers.

FIG. 1B is a schematic illustration of another embodiment of an illumination system 14B having features of the present invention. In this embodiment, the illumination system 14B again selectively generates the first illumination beam 32A and the second illumination beam 32B similar to the illumination system 14A described above. However, in this embodiment, a single illumination source 34AB is utilized, as well as a flip reflector 37A (e.g. a mirror), and a reflector mover 37B (e.g. a rotary motor) that selectively moves the flip reflector 37A. In this embodiment, (i) the illumination source 34AB generates a beam 35 that is directed at the flip reflector 37A, and (ii) the reflector mover 37B selectively and alternatively positions and rotates the flip reflector 37A to direct the beam 35 at the first illumination optical assembly 36A or the second illumination optical assembly 36B.

It should be noted that in the embodiment illustrated in FIG. 1B, the illumination system 14B is illustrated as generating the first illumination beam 32A and the second illumination beam 32B at the same time. However, in this embodiment, the illumination system 14B is only capable of alternatively generating the first illumination beam 32A and the second illumination beam 32B.

FIG. 1C is a schematic illustration of yet another embodiment of an illumination system 14C having features of the present invention. In this embodiment, the illumination system 14C again selectively generates the first illumination beam 32A and the second illumination beam 32B similar to the illumination system 14B described above. In this embodiment, the single illumination source 34AB again generates the beam 35. However, in this embodiment, the illumination system 14C includes (i) a beam splitter 39A that splits the beam 35 into two beams, with one beam being directed to the first illumination optical assembly 36A and the other beam is directed at the second illumination optical assembly 36B, (ii) a first beam blocker 39B that can be moved to selectively block the beam directed to the first illumination optical assembly 36A, and (iii) a second beam blocker 39C that can be moved to selectively block the beam directed to the second illumination optical assembly 36B.

Figure 1D:
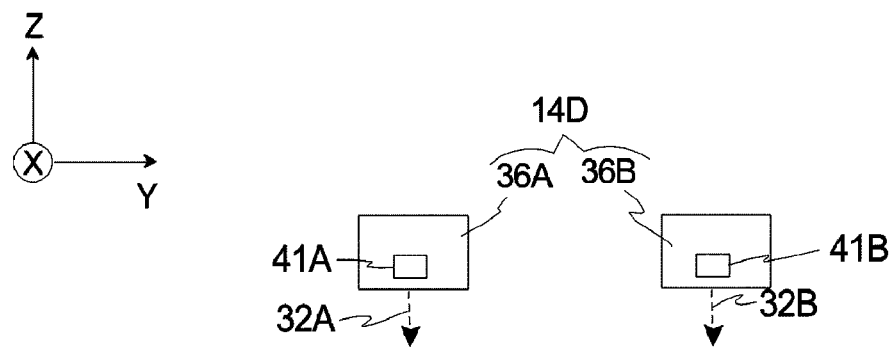
FIG. 1D is a schematic illustration of a portion of still another embodiment of an exposure apparatus having features of the present invention.

FIG. 1D is a schematic illustration of a portion of still another embodiment of an illumination system 14D having features of the present invention. As illustrated in this embodiment, the illumination system 14D again includes the first illumination optical assembly 36A that guides the first illumination beam 32A from to the first mask 26A (illustrated in FIG. 1A), and the second illumination optical assembly 36B that guides the second illumination beam 32B to the second mask 26B (illustrated in FIG. 1A). However, in this embodiment, the illumination system 14D further includes a first polarizer 41A that adjusts the polarization of the first illumination beam 32A, and a second polarizer 41B that adjusts the polarization of the second illumination beam 32B.

For example, the first illumination optical assembly 36A can be designed so that the first illumination beam 32A has a first polarization and the second optical assembly 36B can be designed so that the second illumination beam 32B has a second polarization that is different than the first polarization. For example, the one of the polarizations can be a TE polarization (sometimes referred to as an X polarization) and the other of the polarizations can be a TM polarization (sometimes referred to as a Y polarization). The benefits of having different polarizations for the illumination beams 32A, 32B is described in more detail below.

The design of the polarizers 41A, 41B can be varied depending on the requirements of the exposure apparatus 10 and the illumination system 14D. For example, one or both of the polarizers 41A, 41B can include a half wave plate, a combination of a quarter wave plate and a half wave plate, a polarization rotator, a wire-grid polarizer, and/or a pile of plates type polarizer. The first and second illumination optical assembly is disclosed, for example, in United States Patent Application Publication Nos. US 2007/0258077 A1, US2008/0246932 A1, US 2009/0086186 A1, and US 2009/0040490 A1. The teachings of United States Patent Application Publication Nos. US 2007/0258077 A1, US2008/0246932 A1, US 2009/0086186 A1, and US 2009/0040490 A1 are incorporated by reference.

Alternatively, instead of using polarizers 41A, 41B, the elements of each illumination optical assembly 36A, 36B can designed to achieve the desired polarization of the illumination beams 32A, 32B.

Figure 2A:
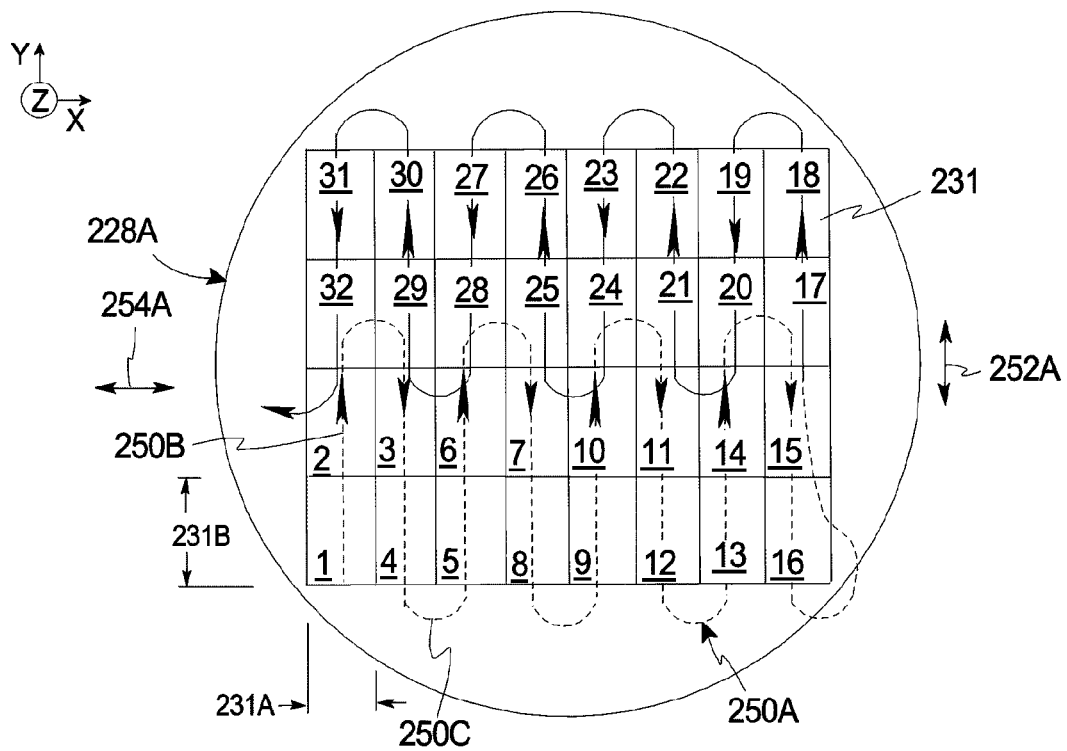
FIG. 2A is a simplified top view of a first embodiment of a substrate exposed by the exposure apparatus of FIG. 1A.

FIG. 2A is a simplified top view of one non-exclusive embodiment of a substrate 228A that can be exposed with the exposure apparatus 10 described above. In this embodiment, the substrate 228A is a generally disk shaped, thin slice of semiconductor material, e.g. a semiconductor wafer, that serves as a substrate for photolithographic patterning. Typically, the disk shaped substrate 228A is divided into a plurality of rectangular shaped sites 231 (e.g. chips) that are organized into a plurality of rows (along the X axis) and columns (along the Y axis). As used herein, the term "site" shall mean an area on the substrate 228A to which the entire or a part of the mask pattern 29A, 29B (illustrated in FIG. 1A) has been transferred. For example, for a semiconductor wafer, each site 231 is an integrated circuit that includes a number of connected circuit elements that were transferred to the substrate 228A by the exposure apparatus 10. In this example, each site 231 is an integral die piece that can be sliced from the wafer.

The size of the substrate 228A and the number of sites 231 on the substrate 228A can be varied. For example, the substrate 228A can have a diameter of approximately three hundred millimeters. Alternatively, the substrate 228A can have a diameter that is greater than or less than three hundred millimeters and/or the substrate 228A can have a shape that is different than disk shaped (e.g. rectangular shaped). For example, the substrate 228A can have a diameter of four hundred and fifty millimeters.

Further, in the embodiment illustrated in FIG. 2A, the substrate 228A is illustrated as having thirty-two separate sites 231. Alternatively, for example, the substrate 228A can be separated into greater than or fewer than thirty-two sites 231.

In one embodiment, each site 231 is generally rectangular shaped and has a first site dimension 231A (measured along the X axis) that is less than a second site dimension 231B (measured along the Y axis). In one non-exclusive embodiment, each site 231 has a first site dimension 231A of approximately twenty-six (26) millimeters, and a second site dimension 231B of approximately thirty-three (33) millimeters. Alternatively, for example, each site 231 can have a first site dimension 231A that is greater than or less than twenty-six (26) millimeters, and a second site dimension 231B that is greater than or less than thirty-three (33) millimeters. For example, each site 231 can have a first site dimension 231A of approximately sixteen (16) millimeters, and a second site dimension 231B of approximately thirty-two (32) millimeters.

In FIG. 2A, the sites 231 have been labeled "1" through "32" (one through thirty-two). In this example, the labels "1" through "32" represent one non-exclusive embodiment of the sequence in which the mask patterns 29A, 29B can be transferred to the sites 231 on the substrate 228A. More specifically, as provided herein, the exposure apparatus 10 can transfer the first mask pattern 29A from the first mask 26A to the site 231 labeled "1" (sometimes referred to as the "first site"). Next, the exposure apparatus 10 can transfer the second mask pattern 29B from the second mask 26B to the site 231 labeled "2" (sometimes referred to as the "second site"). Subsequently, the exposure apparatus 10 can transfer the second mask pattern 29B from the second mask 26B to the site 231 labeled "3" (sometimes referred to as the "third site"). Next, the exposure apparatus 10 can transfer the first mask pattern 29A from the first mask 26A to the site 231 labeled "4" (sometimes referred to as the "fourth site"). Subsequently, the exposure apparatus 10 can continue repeating the sequencing of the transferring of the first mask pattern 29A and the second mask pattern 29B (i.e., in a first, second, second, first sequence) to the sites 231 labeled "6", "7", "8", . . . and "32". In an alternative embodiment, the exposure apparatus 10 can alternate between transferring the first mask pattern 29A and the second mask pattern 29B to the sites 231 labeled "1", "2", "3", "4", "5", . . . and "32".

Moreover, FIG. 2A includes an exposure pattern 250A (illustrated with a dashed line for the lower two rows and a solid line for the upper two rows) which further illustrates the order in which the mask patterns 29A, 29B are transferred to the sites 231. In this example, the exposure pattern 250A comprises a plurality of scanning operations 250B and a plurality of stepping operations 250C, wherein the scanning operations 250B and the stepping operations 250C alternate so that the exposure proceeds in a scan-step-scan-step-scan (boustrophedonic) fashion. In this embodiment, the scanning 250B occurs as the substrate 228A is moved along a scan axis 252A (the Y axis), and the stepping 250C occurs as the substrate 228A is moved along a step axis 254A (the X axis).

It should be noted that with the use of multiple masks 26A, 26B (illustrated in FIG. 1A), two adjacent sites 231 (e.g. 1 and 2) can be scanned sequentially while moving the substrate 228A at a constant velocity along the scan axis 252A. As a result thereof, the substrate 228A does not have to be stepped and reversed in direction between the exposures of the sites 231. Instead, for the embodiment illustrated in FIG. 2A, the substrate 228A is only stepped between the exposure of pairs of adjacent sites 231 aligned on the scan axis 252A. Stated in another fashion, with the present design, there is one stepping motion for every two sites 231 scanned. This results in fewer steps and significantly improved throughput from the exposure apparatus 10.

It should be noted that in this example, the site 231 that is exposed first and the order in which the sites 231 are exposed can be different than that illustrated in FIG. 2A. Further, the site 231 that is first exposed can be located away from the edge of the substrate 228A.

Figure 2B:
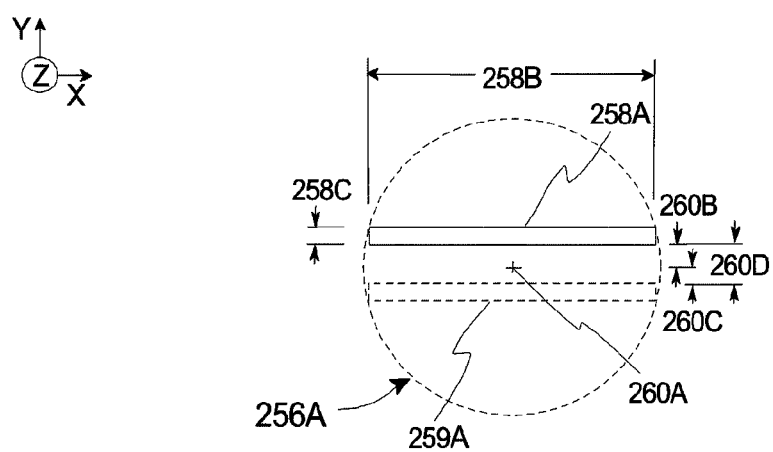
FIG. 2B is a simplified illustration of one embodiment of a field of view of an optical assembly having features of the present invention.

FIG. 2B is a simplified illustration of one embodiment of a field of view 256A (illustrated with a dashed circle) of the projection optical assembly 16 (illustrated in FIG. 1A). As used herein, the term field of view 256A shall mean the maximum image area over which the projection optical assembly 16 can provide a sufficiently accurate image of the mask pattern.

In one embodiment, the field of view 256A defines (i) a first used field 258A (illustrated as a box with solid lines) in which the first pattern beam 38A (illustrated in FIG. 1A) exits the projection optical assembly 16, and (ii) and a spaced apart second used field 259A (illustrated as a box with dashed lines) in which the second pattern beam 38B (illustrated in FIG. 1A) exits the projection optical assembly 16. In one embodiment, the first used field 258A and the second used field 259A are substantially similar in shape and size. As illustrated, the first used field 258A has a rectangular shape that includes a first field dimension 258B that is measured along the first axis (the X axis) and a second field dimension 258C that is measured along the second axis (the Y axis). In this embodiment, the first field dimension 258B is larger than the second field dimension 258C.

In certain embodiments, the projection optical assembly 16 is designed so that the first field dimension 258B is equal to the first site dimension 231A (illustrated in FIG. 2A) and the second field dimension 258B is less than the second site dimension 231B (illustrated In FIG. 2A). In one non-exclusive example, each site 231 has a first site dimension 231A of twenty-six (26) millimeters and a second site dimension 231B of thirty-three (33) millimeters. In this example, the first field dimension 258B can be approximately twenty-six (26) millimeters, and the second field dimension 258C is less than thirty-three (33) millimeters. As non-exclusive examples, the second field dimension 258C can be approximately 4, 5, or 6 millimeters.

In one embodiment, the projection optical assembly 16 has a numerical aperture (NA) of at least approximately 1.30. For example, in one specific non-exclusive embodiment, the projection optical assembly 16 can have a numerical aperture of 1.35. In order to minimize or correct aberrations of the projection optical assembly 16 at such a high NA, the projection optical assembly 16 can be catadioptric. In one embodiment, the used fields 258A, 259A are off-axis in order to avoid obscurations from the relative surfaces. Stated in another fashion, in the embodiment illustrated in FIG. 2B, (i) the first used field 258A is offset from a field axis 260A of the field of view 256A a first offset distance 260B, (ii) the second used field 259A is offset from the field axis 260A a second offset distance 260C, and (iii) the first used field 258A and the second used field 259A are spaced apart a separation distance 260D. Moreover, the used fields 258A, 259A are positioned on opposite sides of the field axis 260A, and the used fields 258A, 259A are substantially parallel to each other. In one non-exclusive embodiment, each offset distances 260B, 260C is approximately 2.5 millimeters, and the separation distance 260D is approximately 5 millimeters. Alternatively, the offset distances 260B, 260C can be greater than or less than 2.5 millimeters.

Figure 2C:
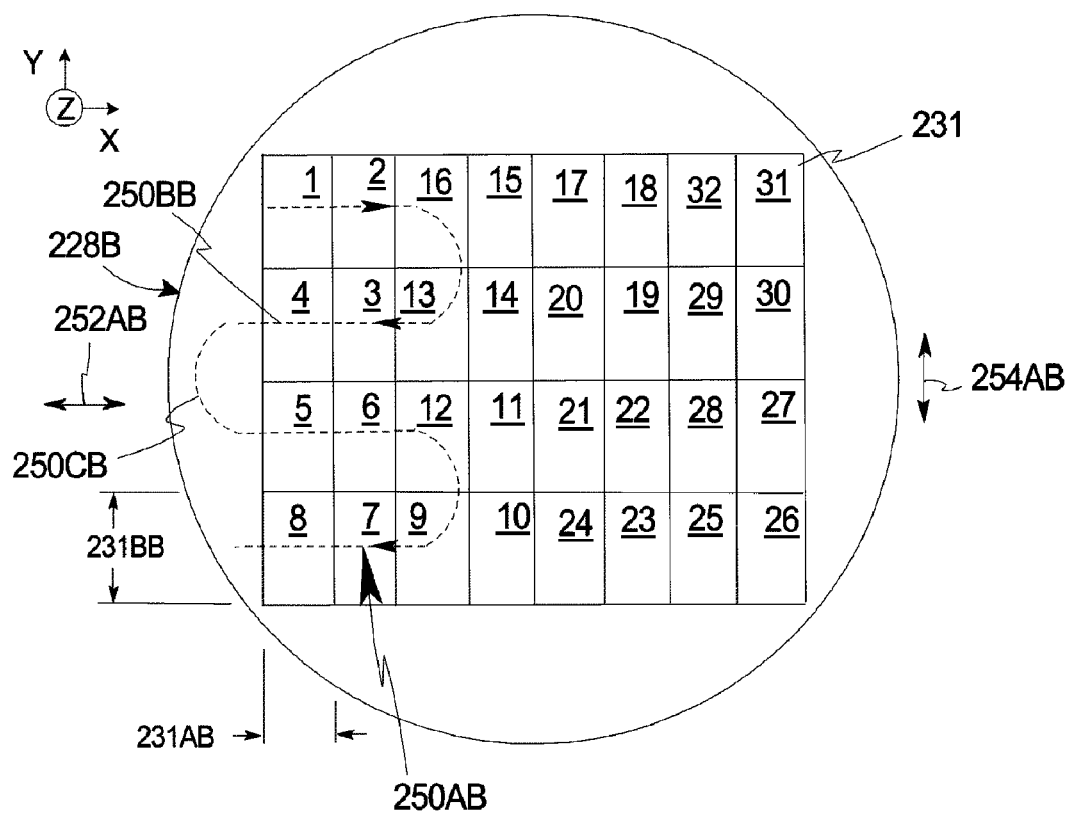
FIG. 2C is a simplified top view of another embodiment of a substrate exposed by the exposure apparatus of FIG. 1A.

FIG. 2C is a simplified top view of another embodiment of a substrate 228B exposed by the exposure apparatus 10 disclosed herein. The design of the substrate 228B is similar to the substrate 228A described above and illustrated in FIG. 2A. However, in FIG. 2C, the orientation and order in which the sites 231 are exposed is different. More specifically, the sites 231 are scanned along the X axis (e.g. the short dimension of the sites 231) and stepped along the Y axis.

In this embodiment, the substrate 228B is again illustrated as having thirty-two separate sites 231. However, in this embodiment, the substrate 228B has been rotated ninety degrees from that illustrated in FIG. 2A so that each site 231 has the first site dimension 231AB (measured along the X axis) that is less than the second site dimension 231BB (measured along the Y axis). In one non-exclusive embodiment, each site 231 has a first site dimension 231AB of approximately twenty-six (26) millimeters, and a second site dimension 231BB of approximately thirty-three (33) millimeters.

In FIG. 2C, the sites 231 have again been labeled "1" through "32" (one through thirty-two). In this example, the labels "1" through "32" represent one non-exclusive embodiment of the sequence in which the mask patterns 29A, 29B can be transferred to the sites 231 on the substrate 228A.

Moreover, FIG. 2C includes an exposure pattern 250AB (illustrated with a dashed line) which further illustrates the order in which the mask patterns 29A, 29B are transferred to sites 231. In this example, the exposure pattern 250AB again includes a plurality of scanning operations 250BB and a plurality of stepping operations 250CB, wherein the scanning operations 250BB and the stepping operations 250CB alternate so that the exposure proceeds in a scan-step-scan-step-scan fashion. In this embodiment, the scanning 250BB occurs as the substrate 228B is moved along a scan axis 252AB (the X axis), and the stepping 250CB occurs as the substrate 228B is moved along a step axis 254AB (the Y axis).

Again, because multiple masks 26A, 26B (illustrated in FIG. 1A) are utilized, two adjacent sites 231 (e.g. 1 and 2) can be scanned sequentially while constantly moving the substrate 228B along the scan axis 252AB.

It should be noted that in this example, the site 231 that is exposed first and the order in which the sites 231 are exposed can be different than that illustrated in FIG. 2C. Further, the site 231 that is first exposed can be located away from the edge of the substrate 228B.

Figure 2D:
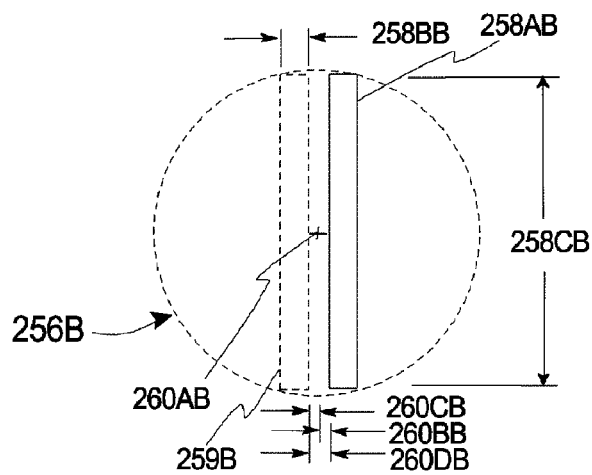
FIG. 2D is a simplified illustration of a field of view of another embodiment of an optical assembly having features of the present invention.

FIG. 2D is a simplified illustration of a field of view 256B of another embodiment of an projection optical assembly 16 (illustrated in FIG. 1A) having features of the present invention. As provided herein, in certain embodiments, the field of view 256B of the projection optical assembly 16 must be relatively large in order to transfer a relatively large pattern beam 38A, 38B (illustrated in FIG. 1A) to the site 231 (illustrated in FIG. 2C).

In this embodiment, the field of view 256B again defines a first used field 258AB (illustrated as a box with solid lines) and a spaced apart second used field 259B (illustrated as a box with dashed lines). In this embodiment, the first used field 258AB and the second used field 259B are again similar in shape and size. As illustrated, the first used field 258AB has a rectangular shape that includes a first field dimension 258BB that is measured along the first axis (the X axis) and a second field dimension 258CB that is measured along the second axis (the Y axis). In this embodiment, the second field dimension 258CB is larger than the first field dimension 258BB.

In certain embodiments, the projection optical assembly 16 is designed so that the first field dimension 258BB is less than the first site dimension 231AB (illustrated in FIG. 2C) and the second field dimension 258CB is equal to the second site dimension 231BB (illustrated in FIG. 2C).

In one non-exclusive example, each site 231 has a first site dimension 231A of twenty-six (26) millimeters and a second site dimension 231B of thirty-three (33) millimeters. In this example, the second field dimension 258B can be approximately thirty-three (33) millimeters, and the first field dimension 258A is less than twenty-six (26) millimeters. As non-exclusive examples, the first field dimension 258A can be approximately 2, 2.5, 3, 4, 5, or 6 millimeters.

In this embodiment, the used fields 258AB, 259B have been rotated by approximately 90 degrees from the orientation of the used fields 258A, 259A in the embodiment illustrated in FIG. 2B. Further, in this embodiment, the used fields 258AB, 259B are off-axis in order to avoid obscurations from the relative surfaces. In this embodiment, (i) the first used field 258AB is offset from the field axis 260AB a first offset distance 260BB, (ii) the second used field 259B is offset from the field axis 260AB a second offset distance 260CB, and (iii) the first used field 258AB and the second used field 259B are spaced apart a separation distance 260DB. Moreover, the used fields 258AB, 259B are positioned on opposite sides of the field axis 260AB, and the used fields 258AB, 259B are substantially parallel to each other.

In order to minimize the impact of the orientation change, the used fields 258AB, 259B can be moved closer to a field axis 260AB. More specifically, for example, each offset distance 260BB, 260CB can be approximately 1.5 millimeters, and the separation distance 260DB is approximately 3 millimeters. Alternatively, the offset distances 260BB, 260CB can be greater than or less than 1.5 millimeters.

An additional discussion of scanning along the short dimension of each site is disclosed in concurrently filed application Ser. No. 12/481,447, filed on Jun. 9, 2009, entitled "APPARATUS FOR SCANNING SITES ON A WAFER ALONG A SHORT DIMENSION OF THE SITES", which is assigned to the assignee of the present invention, and is incorporated by reference herein as far as permitted.

Figure 3A:
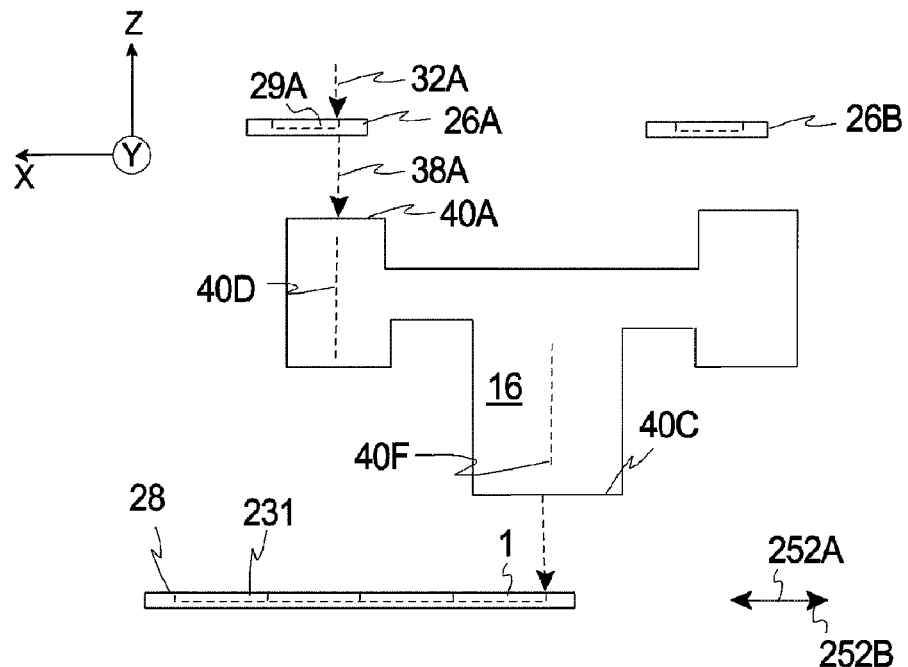
FIG. 3A is a simplified side view of a first mask, a second mask, an optical assembly, and a substrate at a beginning of an exposure of a first site.

FIGS. 3A-3D further illustrate one non-exclusive embodiment of how a substrate 28 can be exposed. More specifically, FIG. 3A is a simplified side view of the first mask 26A, the second mask 26B, the projection optical assembly 16, and the substrate 28 at a beginning of an exposure of a first site 1. At the start of exposure of the first site 1, the control system 24 (illustrated in FIG. 1A) controls the illumination system 14A (illustrated in FIG. 1A) to generate the slit shaped first illumination beam 32A that is directed at the first mask 26A, and controls the first mask stage assembly 18A (illustrated in FIG. 1A) to position the first mask 26A so that the first mask pattern 29A is illuminated near a right side of the pattern 29A. This causes a resulting first pattern beam 38A to be directed by the projection optical assembly 16 at the right side of the first site 1.

Additionally, as illustrated in FIG. 3A, the first pattern beam 38A is initially directed toward the first optical inlet 40A along the first inlet axis 40D. The first pattern beam 38A is subsequently redirected and focused within the projection optical assembly 16 until the first pattern beam 38A is ultimately directed by the projection optical assembly 16 from the optical outlet 40C offset from the outlet axis 40F. More particularly, the first pattern beam 38A is directed by the projection optical assembly 16 through the optical outlet 40C toward a right side of the first site 1.

Further, at the beginning of the exposure of the first site 1, the control system 24 (i) controls the first mask stage assembly 18A so that the first mask 26A is being moved at a constant velocity in a first scan direction 252B (from left to right in FIG. 3A) along the scan axis 252A (the X axis), and (ii) controls the substrate stage assembly 20 (illustrated in FIG. 1A) so that the substrate 28 is also being moved at a constant velocity in the first scan direction 252B along the scan axis 252. With the present design, in certain embodiments, both the first mask 26A and the substrate 28 are moved synchronously in the same scan direction 252B. Further, for example, if the projection optical assembly 16 has a reduction factor of four, the first mask 26A is moved at a rate that is four times greater than that of the substrate 28. Alternatively, the first mask 26A and the substrate 28 can be moved in opposite directions along the scan axis 252A during scanning of the sites 231.

As the first mask 26A is being moved in the first scan direction 252B, the first pattern beam 38A continues to illuminate a portion of the first mask 26A from initially near the right side toward the left side. At the same time, the substrate 28 is being moved in the first scan direction 252B so that the first pattern beam 38A is directed initially at the right side and continuously and subsequently toward the left side of the substrate 28.

Figure 3B:
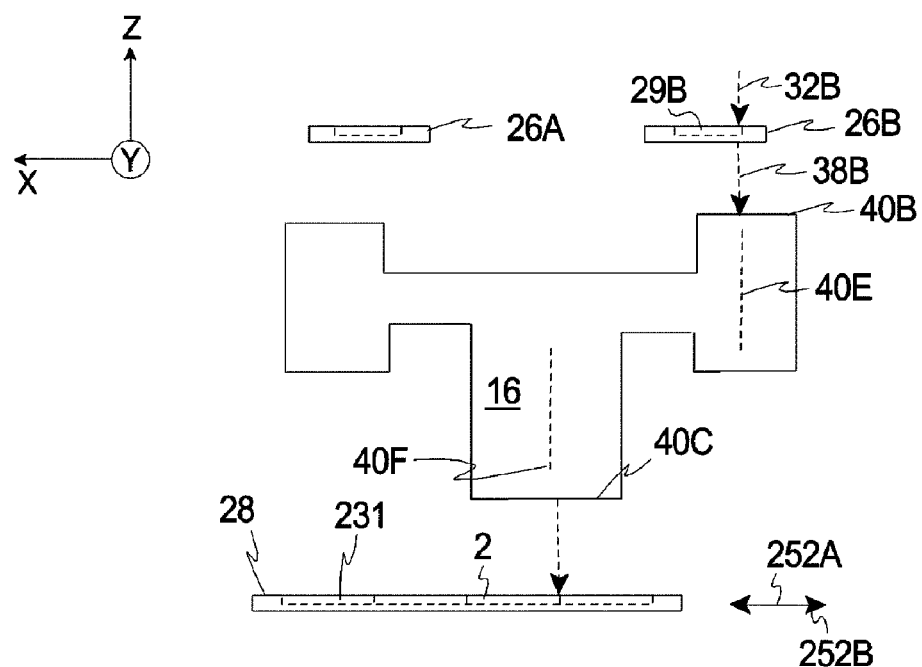
FIG. 3B is a simplified side view of the first mask, the second mask, the optical assembly, and the substrate at a beginning of an exposure of a second site.

FIG. 3B is a simplified side view of the first mask 26A, the second mask 26B, the projection optical assembly 16, and the substrate 28 at a beginning of an exposure of the second site 2.

At the start of exposure of the second site 2, the control system 24 (illustrated in FIG. 1A) controls the illumination system 14A (illustrated in FIG. 1A) to generate the slit shaped second illumination beam 32B that is directed at the second mask 26B, and controls the second mask stage assembly 18B (illustrated in FIG. 1A) to position the second mask 26B so that a second mask pattern 29B is illuminated near the right side of the pattern 29B. This causes a resulting second pattern beam 38B to be directed by the projection optical assembly 16 at a portion of the second site 2.

Additionally, as illustrated in FIG. 3B, the second pattern beam 38B is initially directed toward a second optical inlet 40B of the projection optical assembly 16 along a second inlet axis 40E. The second pattern beam 38B is subsequently redirected and focused within the projection optical assembly 16 until the second pattern beam 38B exits the optical outlet 40C offset from the outlet axis 40F.

Further, at the beginning of the exposure of the second site 2, the control system 24 (i) controls the second mask stage assembly 18B so that the second mask 26B is being moved at a constant velocity in the first scan direction 252B along the scan axis 252A, and (ii) controls the substrate stage assembly 20 (illustrated in FIG. 1A) so that the substrate 28 is also being moved at a constant velocity in the first scan direction 252B. With the present design, in certain embodiments, both the second mask 26B and the substrate 28 are moved synchronously in the same scan direction 252B.

It should be noted that with the design of the projection optical assembly 16 as illustrated herein, the exposure of the first site 1 and the second site 2 occurs with the substrate 28 being moved in the same first scan direction 252B at a substantially constant velocity. This enables greater throughput for the exposure apparatus 10 (illustrated in FIG. 1A).

Figure 3C:
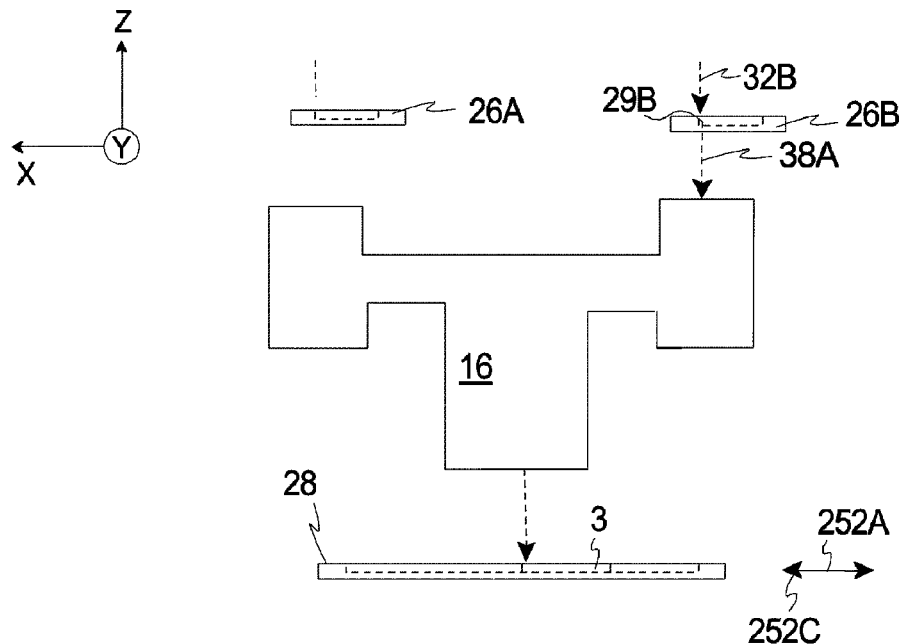
FIG. 3C is a simplified side view of the first mask, the second mask, the optical assembly, and the substrate at a beginning of an exposure of a third site.

FIG. 3C is a simplified side view of the first mask 26A, the second mask 26B, the projection optical assembly 16, and the substrate 28 at a beginning of an exposure of the third site 3. It should be noted that after the exposure of the second site illustrated in FIG. 3B, the substrate 28 is stepped into the page along the Y axis.

During the exposure of the third site 3, the control system 24 (illustrated in FIG. 1A) controls the illumination system 14A (illustrated in FIG. 1A) to generate the slit shaped second illumination beam 32B that is directed at the second mask 26B, and controls the second mask stage assembly 18B (illustrated in FIG. 1A) to position the second mask 26B so that the first mask pattern 29B is illuminated near its left side. This causes a resulting second pattern beam 38B to be directed by the projection optical assembly 16 at a portion of the third site 3.

Further, during the exposure of the third site 3, the control system 24 (i) controls the second mask stage assembly 18B so that the second mask 26B is being moved at a constant velocity in a second scan direction 252C (from right to left in FIG. 3C, opposite from the first scan direction 252B) along the scan axis 252A (the X axis), and (ii) controls the substrate stage assembly 20 (illustrated in FIG. 1A) so that the substrate 28 is also being moved at a constant velocity in the second scan direction 252C.

Figure 3D:
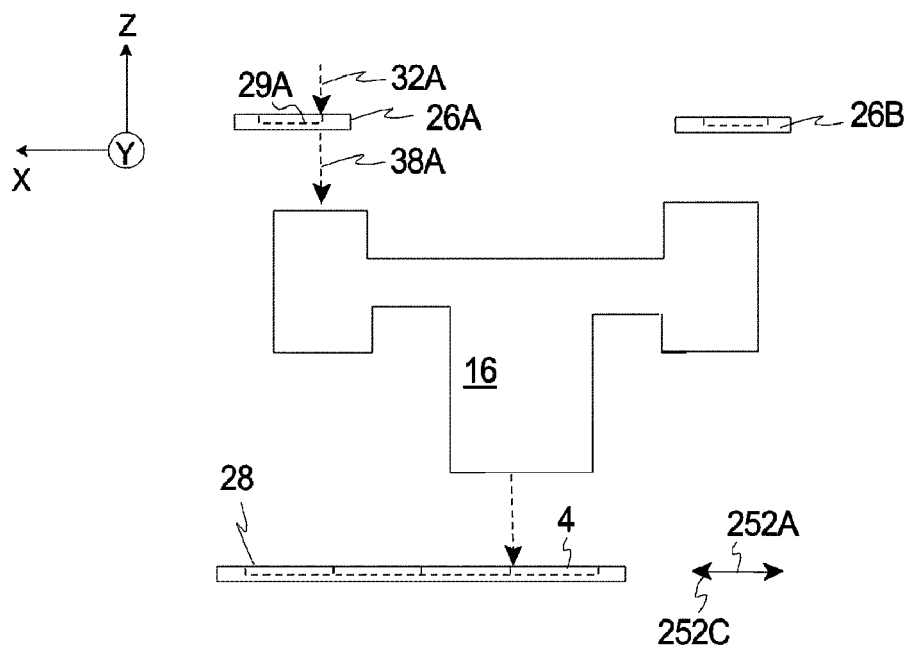
FIG. 3D is a simplified side view of the first mask, the second mask, the optical assembly, and the substrate at a beginning of an exposure of a fourth site.

FIG. 3D is a simplified side view of the first mask 26A, the second mask 26B, the projection optical assembly 16, and the substrate 28 at a beginning of an exposure of the fourth site 4. At the start of exposure of the fourth site 4, the control system 24 (illustrated in FIG. 1A) controls the illumination system 14A (illustrated in FIG. 1A) to generate the slit shaped first illumination beam 32A that is directed at the first mask 26A, and controls the first mask stage assembly 18A (illustrated in FIG. 1A) to position the first mask 26A so that the first mask pattern 29A is illuminated near its left side. This causes a resulting first pattern beam 38A to be directed by the projection optical assembly 16 at a portion of the fourth site 4.

During the exposure of the fourth site 4, the control system 24 (i) controls the first mask stage assembly 18A so that the first mask 26A is being moved at a substantially constant velocity in the second scan direction 252C along the scan axis 252, and (ii) controls the substrate stage assembly 20 (illustrated in FIG. 1A) so that the substrate 28 is also being moved at a substantially constant velocity in the second scan direction 252C.

It should be noted that with the design of the projection optical assembly 16 as illustrated herein, the exposure of the third site 3 and the fourth site 4 occur with the substrate 28 being moved in the same second scan direction 252B along the scan axis 252. Further, the four sites 1-4 can be exposed with only one stepping motion.

In the embodiment illustrated in FIGS. 3A-3D, the mask 26A, 26B that is being scanned and the substrate 28 are moved in the same direction during the scan process. Alternatively, the apparatus could be designed so that the mask 26A, 26B that is being scanned and the substrate 28 are moved in opposite directions during the scan process.

FIGS. 4A-4I further illustrate one embodiment of how four sites labeled 1-4 can be exposed using the exposure apparatus 10 described above. In these Figures, the box with solid lines represents the first used field 458, the box with dashed lines represents the second used field 459, and the slashes represent the respective pattern beam. Further, in these Figures, the arrow represents the direction in which the substrate is being moved during scanning at that particular time. During the exposure of the sites 1-4, the substrate is moved down the page, then left, and then up. In FIGS. 4A-4I, it appears that the used fields 458, 459 move, however, the substrate is actually being moved relative to the used fields 458, 459.

Figure 4A:
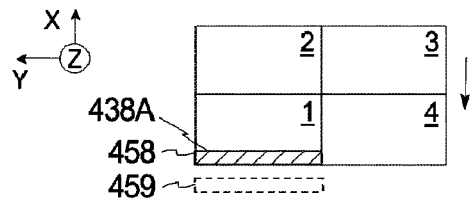
FIGS. 4A-4I illustrate one embodiment of the exposure of four sites.

Starting with FIG. 4A, at the beginning of the exposure of the first site 1, the first pattern beam 438A (illustrated with slashes) is exposing the first site 1 and there is no second pattern beam. At this time, the first used field 458 is positioned over the first site 1, and the second used field 459 is not over any site.

Figure 4F:
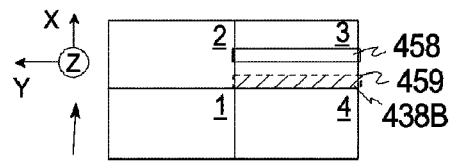
Figure 4B:
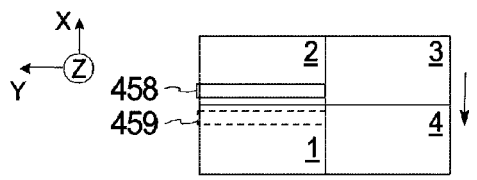

Next, referring to FIG. 4B, after the first site 1 is exposed, the first used field 458 is positioned over the second site 2, and the second used field 459 is positioned over the first site 1. At this time neither of the pattern beams is being generated. The amount of time in which the two beams are off is determined by the distance between the slits and the motion of the stages.

Figure 4G:
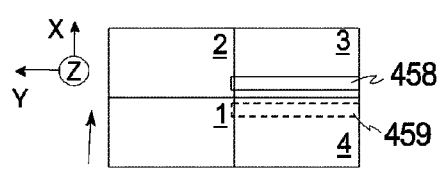
Figure 4C:
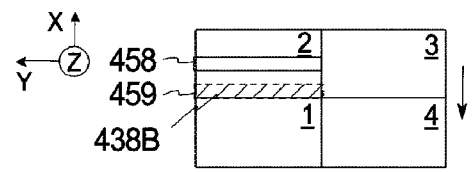

Subsequently, referring to FIG. 4C, once the second used field 459 is positioned over the second site 2, the second pattern beam 438B (illustrated with slashes) begins to expose the second site 2, and there is no first pattern beam.

Figure 4H:
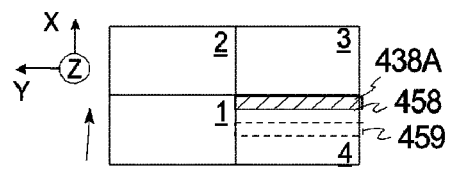
Figure 4D:
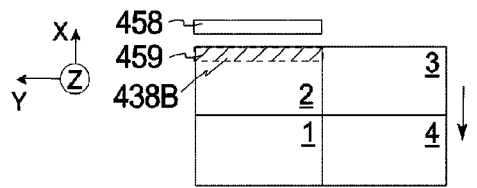

Next, referring to FIG. 4D, while the second used field 459 is still positioned over the second site 2, the second pattern beam 438B (illustrated with slashes) continues to expose the second site 2, and there is no first pattern beam.

Figure 4I:
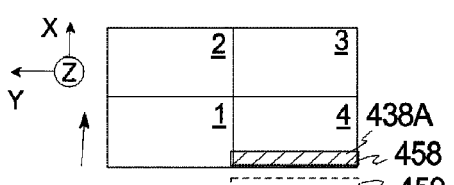
Figure 4E:
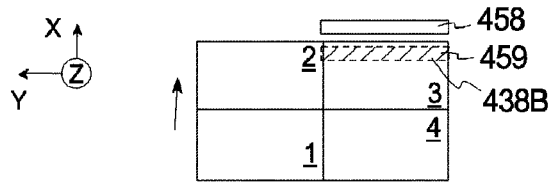

Subsequently, upon the completion of the exposure of the second site 2, the substrate is moved to the left. Referring to FIG. 4E, once the second used field 459 is positioned over the third site 3, the second pattern beam 438B (illustrated with slashes) begins to expose the third site 3, and there is no first pattern beam. At this time, the substrate is being moved up the page.

Next, referring to FIG. 4F, while the second used field 459 is still positioned over the third site 3, the second pattern beam 438B (illustrated with slashes) continues to expose the third site 3, and there is no first pattern beam.

Subsequently, referring to FIG. 4G, after the third site 3 is exposed, the first used field 458 is positioned over the third site 3, and the second used field 459 is positioned over the fourth site 4. At this time neither of the pattern beams are being generated.

Next, referring to FIG. 4H, once the first used field 458 is positioned over the fourth site 4, the first pattern beam 438A (illustrated with slashes) begins to expose the fourth site 4, and there is no second pattern beam.

Subsequently, referring to FIG. 4I, while the first used field 458 is still positioned over the fourth site 4, the first pattern beam 438A (illustrated with slashes) continues to expose the fourth site 4, and there is no second pattern beam.

In this embodiment, the system is designed so that the second site 2 is not exposed until after the exposure of the first site 1 is fully completed.

FIGS. 5A-5I further illustrate another embodiment of how four sites labeled 1-4 can be exposed using the exposure apparatus 10 described above. Similar to the embodiment illustrated in FIGS. 4A-4I, in this embodiment, the box with solid lines is the first used field 558, the box with dashed lines is the second used field 559, and the slashes represent the pattern beam. Further, the arrow again represents the direction in which the substrate is being moved during scanning at that particular time, with the substrate initially being moved down the page, then left, and then up during the exposure of the four sites.

Figure 5A:
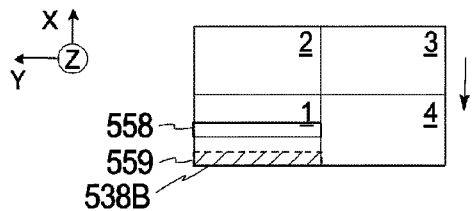
FIGS. 5A-5I illustrate another embodiment of the exposure of four sites.

Starting with FIG. 5A, at the beginning of the exposure of the first site 1, the second pattern beam 538B (illustrated with slashes) is exposing the first site 1 and there is no first pattern beam. At this time, both the first used field 558 and the second used field 559 are positioned over the first site 1. Further, at this time, the substrate is being moved down the page.

Figure 5F:
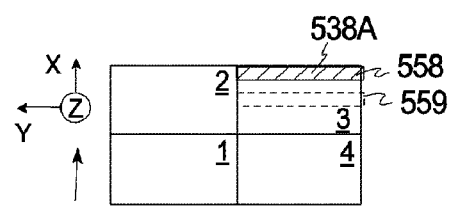
Figure 5B:
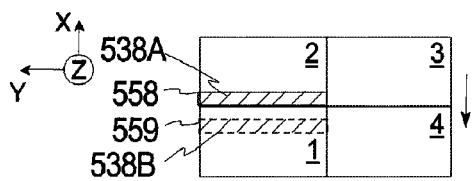

Next, referring to FIG. 5B, during continuation of exposure of the first site 1, the first used field 558 is positioned over the second site 2, and the second used field 559 is positioned over the first site 1. Once the first used field 558 is positioned over the second site 2, the first pattern beam 538A (illustrated with slashes) begins to expose the second site 2. At the same time, the second pattern beam 538B (illustrated with slashes) is still being generated and is still exposing the first site 1. Stated another way, at this time both of the pattern beams 538A, 538B are being generated, and the continuing exposure of the first site 1 coincides or overlaps with the beginning of the exposure of the second site 2.

Figure 5G:
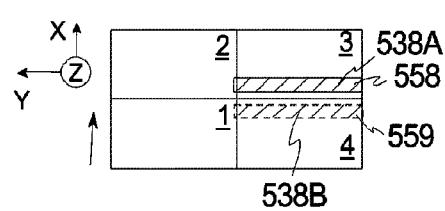
Figure 5C:
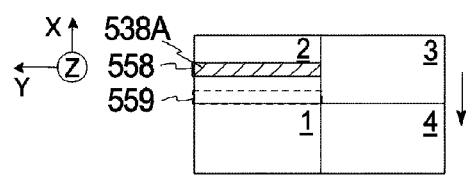

Subsequently, referring to FIG. 5C, both the first used field 558 and the second used field 559 are positioned over the second site 2. Once the second used field 559 is positioned over the second site 2, the second pattern beam is no longer being generated, but the first pattern beam 538A (illustrated with slashes) is still being generated and is continuing exposure of the second site 2.

Figure 5H:
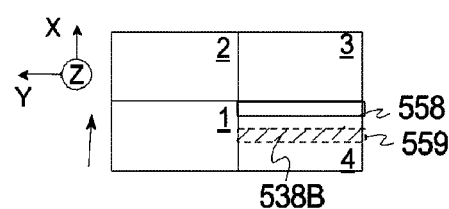
Figure 5D:
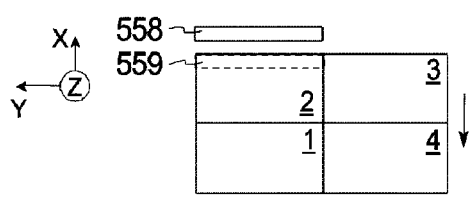

Next, referring to FIG. 5D, only the second used field 559 is still positioned over the second site 2, and the first used field 558 is not positioned over any of the sites. At this time, neither of the pattern beams are being generated.

Subsequently, upon the completion of the exposure of the second site 2, the substrate is moved to the left.

Figure 5I:
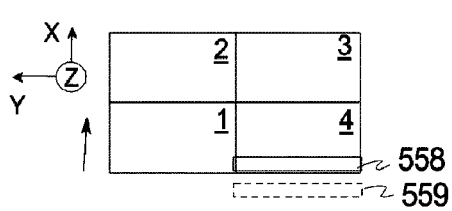
Figure 5E:
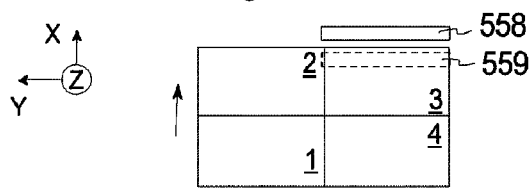

Referring next to FIG. 5E, the second used field 559 is positioned over the third site 3, and the first used field 558 is not positioned over any of the sites. At this time, neither of the pattern beams are being generated. Further, at this time, the substrate is being moved up the page.

Next, referring to FIG. 5F, once the first used field 558 is positioned over the third site 3, the first pattern beam 538A (illustrated with slashes) begins to expose the third site 3. At this time, the second used field 559 is still positioned over the third site 3, and no second pattern beam is being generated.

Subsequently, referring to FIG. 5G, during continuation of exposure of the third site 3, the first used field 558 is still positioned over the third site 3, and the second used field 559 is now positioned over the fourth site 4. Once the second used field 559 is positioned over the fourth site 4, the second pattern beam 538B (illustrated with slashes) begins to expose the fourth site 4. At the same time, the first pattern beam 538A (illustrated with slashes) is still being generated and is still exposing the third site 3. Stated another way, at this time both of the pattern beams 538A, 538B are being generated, and the continuing exposure of the third site 3 coincides or overlaps with the beginning of the exposure of the fourth site 4.

Next, referring to FIG. 5H, both the first used field 558 and the second used field 559 are now positioned over the fourth site 4. Once the first used field 558 is positioned over the fourth site 4, the first pattern beam is no longer being generated, but the second pattern beam 538B (illustrated with slashes) is still being generated and is continuing exposure of the fourth site 4.

Subsequently, referring to FIG. 5I, only the first used field 558 is still positioned over the fourth site 4, and the second used field 559 is not positioned over any of the sites. At this time, neither of the pattern beams are being generated.

In this embodiment, the system is designed so that the exposure of the second site 2 is started prior to the exposure of the first site 1 being fully completed.

Comparing the exposures illustrated in FIGS. 4A-4I with exposures illustrated in FIGS. 5A-5I, the overall scanning distance is longer for the embodiment illustrated in FIGS. 4A-4I.

FIGS. 6A-6I further illustrate another embodiment of how four sites labeled 1-4 can be exposed using the exposure apparatus 10 as illustrated in FIG. 1A and as described above. Similar to the embodiment illustrated in FIGS. 4A-4I and 5A-5I, in this embodiment, the box with solid lines is the first used field 658, the box with dashed lines is the second used field 659, and the slashes represent the pattern beam. Further, the arrow again represents the direction in which the substrate is being moved during scanning at that particular time, with the substrate initially being moved down the page, then left, and then up during the exposure of the four sites.

Figure 6A:
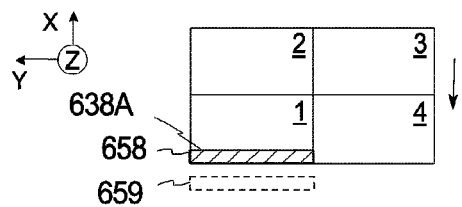
FIGS. 6A-6I illustrate yet another embodiment of the exposure of four sites.

Starting with FIG. 6A, at the beginning of the exposure of the first site 1, the first pattern beam 638A (illustrated with slashes) is exposing the first site 1 and there is no second pattern beam. At this time, the first used field 658 is positioned over the first site 1, and the second used field 659 is not over any of the sites 1-4.

Figure 6F:
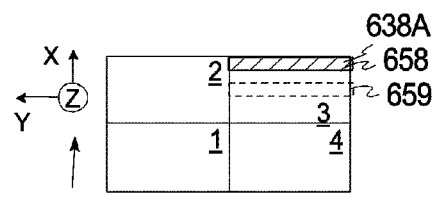
Figure 6B:
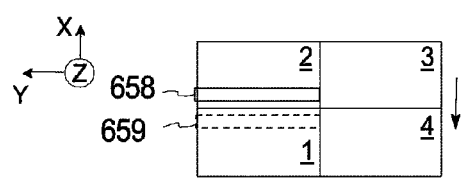

Next, referring to FIG. 6B, after the first site 1 is exposed, the first used field 658 is positioned over the second site 2, and the second used field 659 is positioned over the first site 1. At this time neither of the pattern beams is being generated.

Figure 6G:
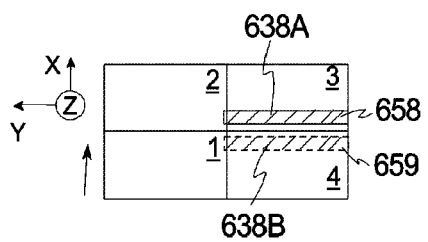
Figure 6C:
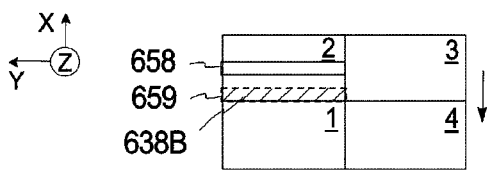

Subsequently, referring to FIG. 6C, once the second used field 659 is positioned over the second site 2, the second pattern beam 638B (illustrated with slashes) begins to expose the second site 2, and there is no first pattern beam.

Figure 6H:
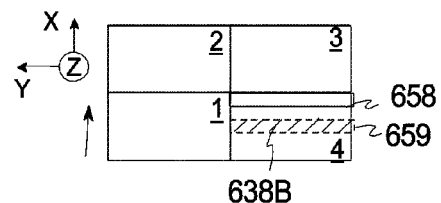
Figure 6D:
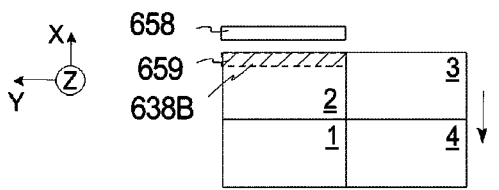

Next, referring to FIG. 6D, while the second used field 659 is still positioned over the second site 2, the second pattern beam 6386B (illustrated with slashes) continues to expose the second site 2, and there is no first pattern beam.

Figure 6I:
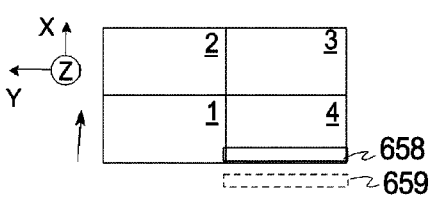
Figure 6E:
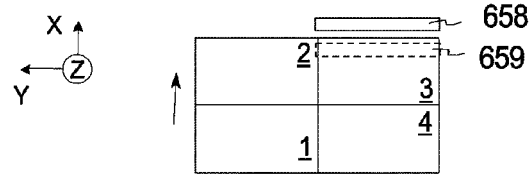

Subsequently, upon the completion of the exposure of the second site 2, the substrate is moved to the left. Referring to FIG. 6E, once the second used field 659 is positioned over the third site 3, neither of the pattern beams is being generated.

Next, referring to FIG. 6F, once the first used field 658 is positioned over the third site 3, the first pattern beam 638A (illustrated with slashes) begins to expose the third site 3, and there is no second pattern beam.

Subsequently, referring to FIG. 6G, while still exposing the third site 3, the first used field 658 is positioned over the third site 3, and the second used field 659 is positioned over the fourth site 4. At this time both pattern beams 638A, 638B are being generated.

Next, referring to FIG. 6H, with the second used field 659 is still positioned over the fourth site 4, the second pattern beam 638B (illustrated with slashes) continues to expose the fourth site 4, and there is no first pattern beam.

Subsequently, referring to FIG. 6I, after the second used field 659 is no longer positioned over the fourth site 4, and there is no pattern beam being generated.

With this sequence, the first site 1 and the third site 3 are exposed with the first pattern beam 638A, and the second site 2 and the fourth site 4 are exposed with the second pattern beam 638B. This sequence provides the same throughput and scanning distance as the sequence illustrated in FIGS. 4A-4I, and requires some times (half as much) when both pattern beams are used simultaneously, like the sequence in FIGS. 5A-5I. The advantage of this sequence is that the two masks are always used for alternate exposures, so the requirement for mask acceleration is much lower. In other words, each of the mask stages can perform its "turn-around" acceleration during an exposure using the other mask, respectively. For future machines with very high throughput, this advantage may make this sequence the preferred embodiment.

FIGS. 7A-7D further illustrate one embodiment of how a first site 1 can be exposed using the exposure apparatus 10 described above. Similar to the embodiments illustrated above, in this embodiment, the box with solid lines represents the first used field 758, the box with dashed lines represents the second used field 759, and the slashes represent the pattern beam. Further, the arrow again represents the direction in which the substrate is being moved during scanning at that particular time, with the substrate initially being moved down the page, and then up during the exposure of the first site 1. Moreover, in this embodiment, the first site 1 is sequentially exposed to the first pattern beam 738A and the second pattern beam 738B.

Figure 7A:
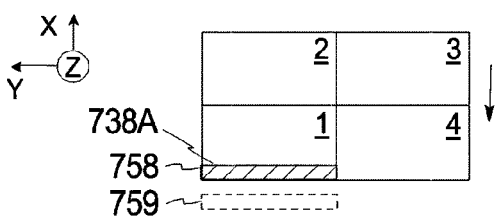
FIGS. 7A-7D illustrate one embodiment of the exposure of one site.

Starting with FIG. 7A, at the beginning of the exposure of the first site 1, the first pattern beam 738A (illustrated with slashes) is exposing the first site 1 and there is no second pattern beam. At this time, the first used field 758 is positioned over the first site 1, and the second used field 759 is not positioned over any of the sites. Further, at this time, the substrate is being moved down the page.

Figure 7C:
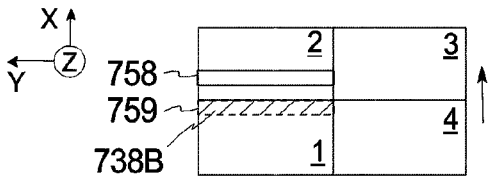
Figure 7B:
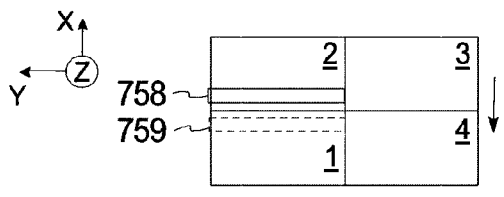

Next, referring to FIG. 7B, the first used field 758 is now positioned over a second site 2 (i.e., not over the first site 1) and the second used field 759 is now positioned over the first site 1, and the substrate is still being moved down the page. At this time, neither of the pattern beams are being generated.

Subsequently, referring to FIG. 7C, the first used field 758 is again positioned over the second site 2 (i.e., not over the first site 1) and the second used field 759 is positioned over the uppermost portion of the first site 1. At this time, the substrate is beginning to be moved back up the page. With the second used field 759 being positioned over the uppermost portion of the second site 2, and the substrate being moved up the page, the second pattern beam 738B is being generated and the first site 1 is being exposed. Further, at this time, no first pattern beam is being generated.

Figure 7D:
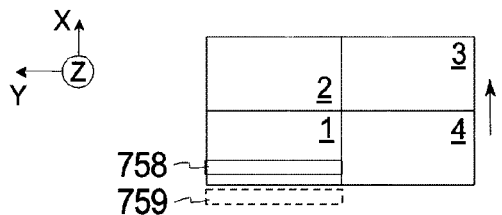

Next, referring to FIG. 7D, the first used field 758 is positioned over the first site 1, and the second used field 759 is not positioned over any of the sites. At this time, neither of the pattern beams are being generated.

Other sequences can be utilized than that illustrated in FIGS. 7A-7D. For example, two adjacent sites can be sequentially scanned in one motion, then the substrate can be turned around and the second exposure of these sites can be performed. For example, while moving substrate in one direction along the X axis, the first site can be exposed using the first reticle and subsequently the second site can be exposed using second reticle. Next, the direction of the substrate along the X axis can be reversed, the second site can exposed using the first reticle, and subsequently the first site can be exposed using the second reticle. This is similar to sequence illustrated in FIG. 6A-6I, except without the Y direction stepping motion.

FIGS. 8A-8D further illustrate another embodiment of how a first site 1 can be exposed using the exposure apparatus 10 described above. Similar to the embodiments illustrated above, in this embodiment, the box with solid lines is the first used field 858, the box with dashed lines is the second used field 859, and the slashes represent the pattern beam. Further, the arrow again represents the direction in which the substrate is being moved during scanning at that particular time, with the substrate being moved down the page during the exposure of the first site 1. Moreover, in this embodiment, the first site 1 is exposed to both the first pattern beam 838A and the second pattern beam 838B.

Figure 8A:
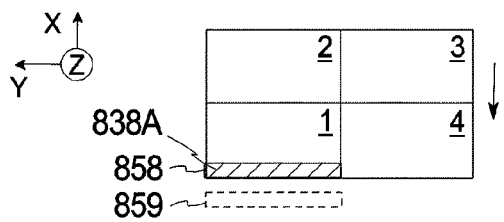
FIGS. 8A-8D illustrate another embodiment of the exposure of one site.

Starting with FIG. 8A, at the beginning of the exposure of the first site 1, the first pattern beam 838A (illustrated with slashes) is exposing the first site 1 and there is no second pattern beam. At this time, the first used field 858 is positioned over the first site 1, and the second used field 859 is not positioned over any of the sites.

Figure 8C:
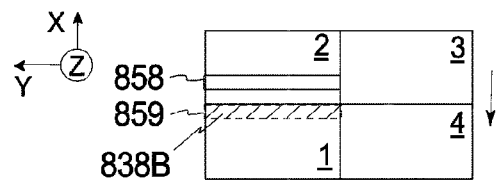
Figure 8B:
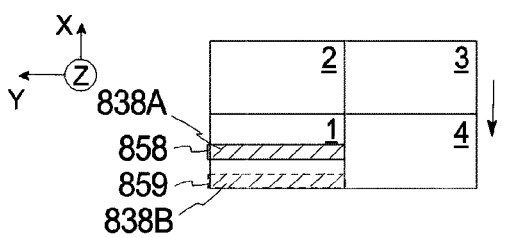

Next, referring to FIG. 8B, both the first used field 858 and the second used field 859 are now positioned over the first site 1. At this time, both of the pattern beams 838A, 838B (illustrated with slashes) are being generated, and the first site 1 is simultaneously being exposed to both the first pattern beam 838A and the second pattern beam 838B.

Subsequently, referring to FIG. 8C, the first used field 858 is now positioned over the second site 2 (i.e., not over the first site 1) and the second used field 859 is still positioned over the first site 1. At this time, the second pattern beam 838B (illustrated with slashes) is exposing the first site 1 and no first pattern beam is being generated.

Figure 8D:
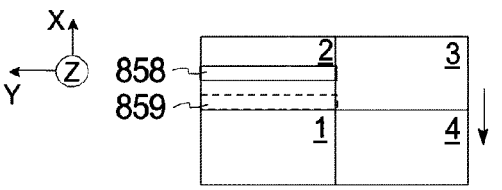

Next, referring to FIG. 8D, both the first used field 858 and the second used field 859 are positioned over the second site 2 (i.e., not over the first site 1). At this time, neither of the pattern beams are being generated.

Figure 9A:
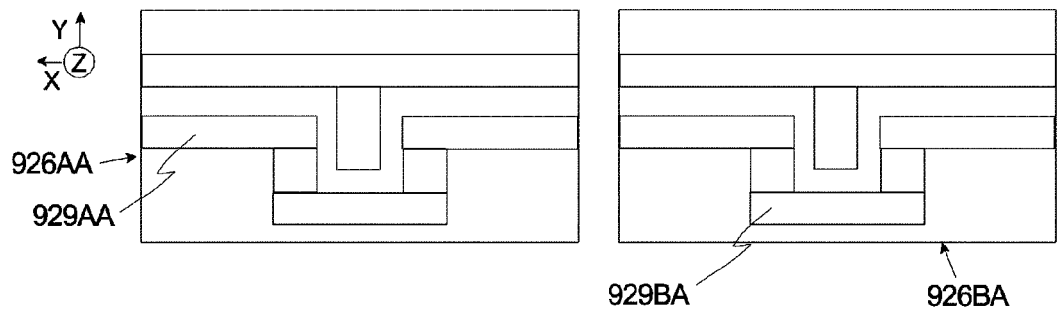
FIG. 9A is a simplified top view of a portion of a pair of masks having features of the present invention.

FIG. 9A is a simplified top view of a portion of a first mask pattern 929AA of a first mask 926AA and a portion of second mask pattern 929BA of a second mask 926BA. In this embodiment, the first mask pattern 929AA is substantially identical to the second mask pattern 929BA. With this design, each mask 926AA, 926BA can be used to transfer approximately the same features to the substrate. Further, the matching masks 926AA, 926AB can be used for the embodiments illustrated in FIGS. 4A-6I.

Figure 9B:
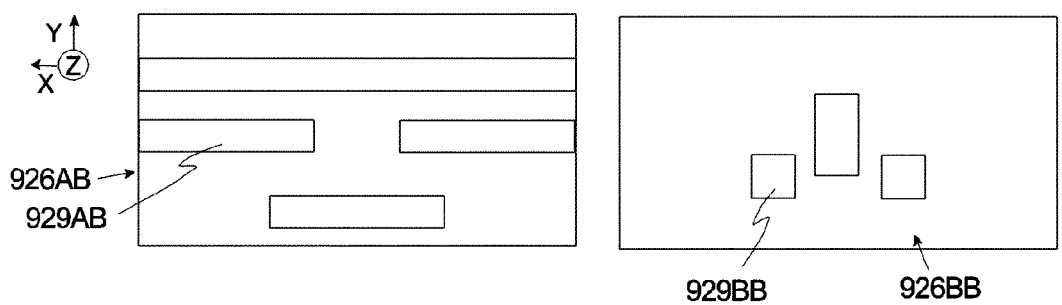
FIG. 9B is a simplified top view of a portion of a another pair of masks having features of the present invention.

FIG. 9B is a simplified top view of another embodiment of a first mask pattern 929BA of a first mask 926AB and a portion of second mask pattern 929BB of a second mask 926BB. In this embodiment, the first mask pattern 929BA is different than the second mask pattern 929BB. As a result thereof, each mask 926AA, 926BA can be used to transfer different features to the substrate. Further, in this embodiment, each site is exposed by both masks 926AA, 926BA as discussed in the embodiments illustrated in FIGS. 7A-8D.

As provided herein, certain features of a mask pattern are transferred to the substrate with improved resolution if the mask pattern is illuminated with an illumination beam having a certain polarization. As a simplified example, (i) features oriented along the X axis as shown in the first mask pattern 926AB can be transferred with improved accuracy if these features are illuminated with a first illumination beam 32A (illustrated in FIG. 1A) having an X polarization; and (ii) features oriented along the Y axis as shown in the second mask pattern 926BB can be transferred with improved accuracy if these features are illuminated with a second illumination beam 32B (illustrated in FIG. 1A) having a Y polarization.

With the designs provided herein, the mask patterns 926AB, 926BB and the illumination beams 32A, 32B can be tailored to transfer the features to the substrate with improved accuracy.

Figure 10A:
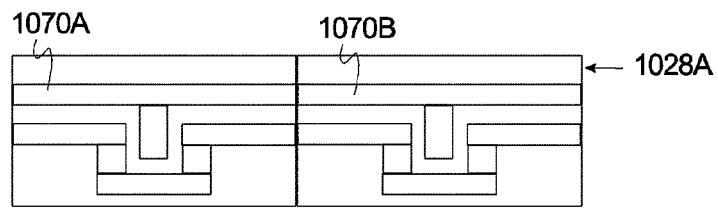
FIG. 10A is a simplified top view of some features transferred to a site.

FIG. 10A is a simplified top view of a portion of a substrate 1028A that illustrate that first features 1070A from the first mask pattern 929AA (illustrated in FIG. 9A) have been transferred to the substrate 1028A, and that second features 1070B from the second mask pattern 929AA (illustrated in FIG. 9A) have been transferred to an adjacent position on the substrate 1028A. As illustrated, the features 1070A are identical to the second features 1070B.

Figure 10B:
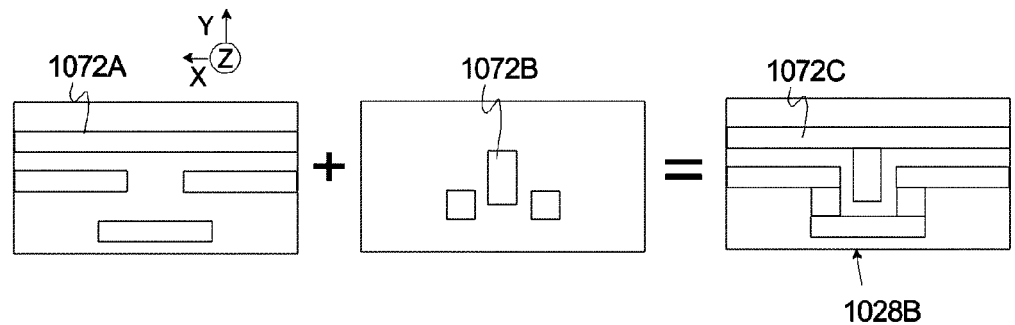
FIG. 10B is a simplified top view of another embodiment of some features transferred to a site.

FIG. 10B is a simplified illustration that illustrates (i) that the first features 1072A from the first mask pattern 929AB (illustrated in FIG. 9A) can be transferred to the substrate 1028B, (ii) that the second features 1072B from the second mask pattern 929BA (illustrate in FIG. 9B) can be transferred to the same site on the substrate 1028B, and (iii) a resulting features 1072C on the substrate 1028B will be somewhat similar to the features illustrated in FIG. 10A.

Figure 11:
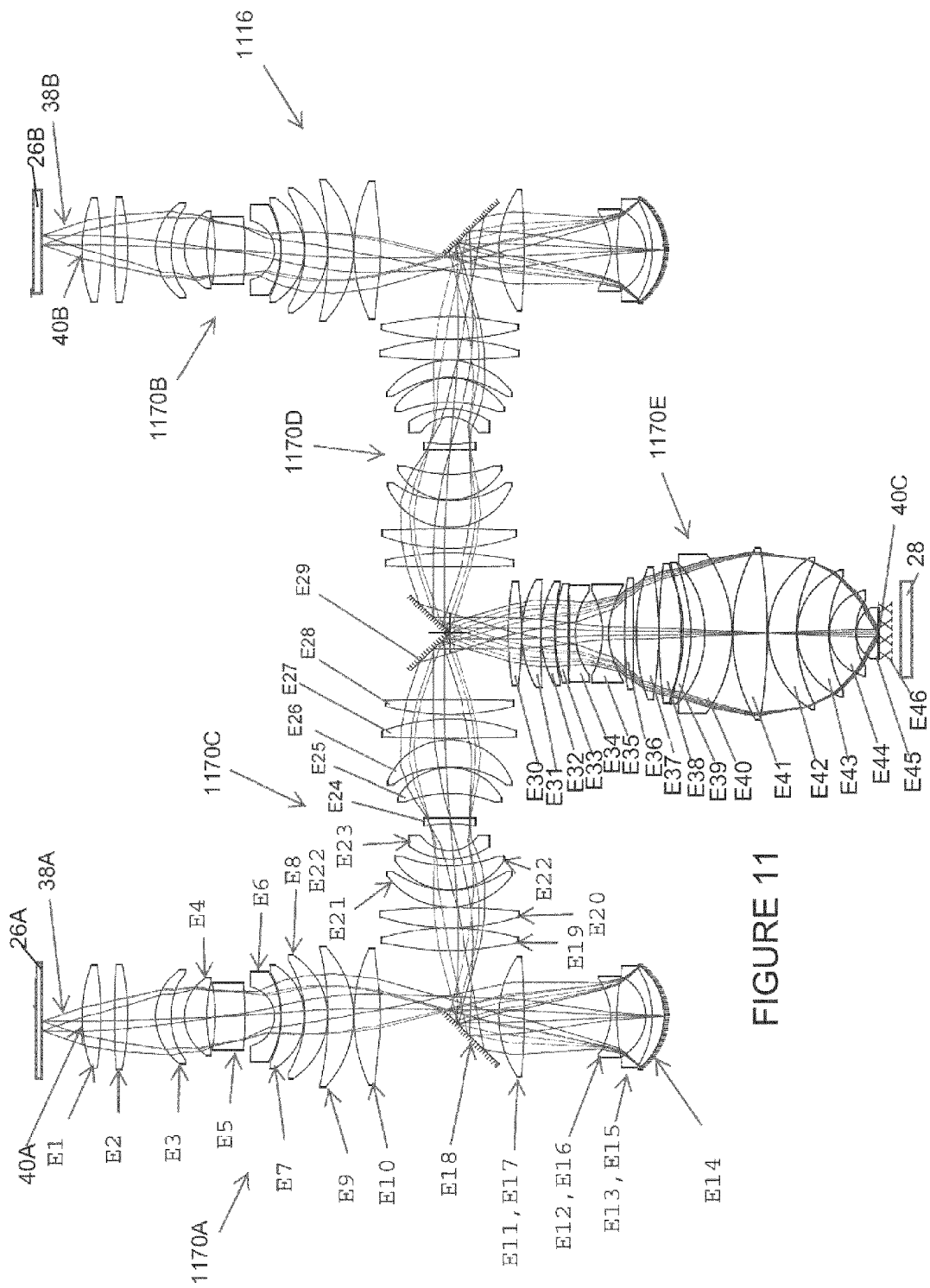
FIG. 11 is a schematic illustration of the first mask, the second mask, the substrate, and an embodiment of an optical assembly having features of the present invention.

FIG. 11 is a schematic illustration of the first mask 26A, the second mask 26B, the substrate 28, and one, non-exclusive embodiment of an optical assembly 1116 having features of the present invention. As noted above, the optical assembly 1116 projects and/or focuses the first pattern beam 38A and the second pattern beam 38B onto the substrate 28.

As illustrated, the optical assembly 1116 includes (i) the first optical inlet 40A, (ii) the second optical inlet 40B, (iii) the an optical outlet 40C, (iv) a plurality of first vertical optical elements 1170A that are positioned along the first inlet axis 40D, (v) a plurality of second vertical optical elements 1170B that are positioned along the second inlet axis 40E, (vi) a plurality of first transverse optical elements 1170C that are positioned along a first transverse axis between the first inlet axis and the outlet axis, (vii) a plurality of second transverse optical elements 1170D that are positioned along a second transverse axis between the second inlet axis and the outlet axis, and (viii) a plurality of third vertical optical elements 1170E that are positioned along the outlet axis.

During projection and/or focusing of the first pattern beam 38A from the first mask 26A onto the substrate 28, the first pattern beam 38A is initially directed through the first optical inlet 40A and through the plurality of first vertical optical elements 1170A. Subsequently, the first pattern beam 38A is redirected toward the plurality of first transverse optical elements 1170C. Next, the first pattern beam 38A is redirected toward the plurality of third vertical optical elements 1170E. The third vertical optical elements 1170E then project and/or focus the first pattern beam 38A through the optical outlet 40C and toward the substrate 28 offset from the outlet axis.

Similarly, during projection and/or focusing of the second pattern beam 38B from the second mask 26B onto the substrate 28, the second pattern beam 38B is initially directed through the second optical inlet 40B and toward the plurality of second vertical optical elements 1170B. Subsequently, the second pattern beam 38B is redirected toward the plurality of second transverse optical elements 1170D. Next, the second pattern beam 38B is redirected toward the plurality of third vertical optical elements 1170E. The third vertical optical elements 1170E then project and/or focus the second pattern beam 38B through the optical outlet 40C and toward the substrate 28 offset from the outlet axis.

As illustrated in FIG. 11, the first vertical optical elements 1170A are substantially identical to the second vertical optical elements 1170B. Additionally, the first transverse optical elements 1170C are substantially identical to the second transverse optical elements 1170D. Accordingly, only the first vertical optical elements 1170A and the first transverse optical elements 1170C will be described in detail herein. Further, both beams 38A, 38B travel through the same third vertical optical elements 1170E.

The first vertical optical elements 1170A include a plurality of individual optical elements labeled E1 through E18. In this embodiment, the first pattern beam 38A is altered and/or focused as it initially passes in a generally downward direction through optical elements E1 through E13. Optical elements E1 through E13 are optical lenses that can be made from material such as silicon dioxide ($SiO_2$). Subsequently, the first pattern beam 38A is reflected off optical element E14 so that it is now directed in a generally upward direction. In one embodiment, optical element E14 can be a concave spherical mirror. Next, the first pattern beam 38A is directed through optical elements E15 through E17. As illustrated in FIG. 11, optical elements E15 through E17 are the same as optical elements E11 through E13, with the first pattern beam 38A passing through optical elements E11 through E13 in one direction and subsequently passing through optical elements E15 through E17 and in the substantially opposite direction. Next, the first pattern beam 38A is reflected transversely off optical element E18 so that it is now redirected toward the first transverse optical elements 1070C. Optical element E18 can be a mirror or other reflecting element.

The first transverse optical elements 1170C include a plurality of individual optical elements E19 through E29. The first pattern beam 38A is altered and/or refocused as it passes in a generally transverse or horizontal direction through optical elements E19 through E28. Optical elements E19 through E28 are optical lenses that can be made from material such as silicon dioxide ($SiO_2$). Subsequently, the first pattern beam 38A is reflected off optical element E29 so that it is now redirected toward the third vertical optical elements 1070E. In one embodiment, optical element E29 can be a field splitting V-mirror.

The third vertical optical elements 1170E include a plurality of optical elements E30 through E45. The first pattern beam 38A is altered and/or refocused as it passes in a generally downward direction through optical elements E30 through E45. Optical elements E30 through E45 are optical lenses that can be made from material such as silicon dioxide ($SiO_2$). The first pattern beam 38A then passes through element E46 (represented as X's), which is a fluid, such as water, if the exposure apparatus 10 is an immersion type system, before being projected and/or focused onto the substrate 28.

It should be noted that the design of the optical assembly 1116 illustrated in FIG. 11 contains many additional intermediate images. This makes it easier to increase the field size without increasing the diameter of the optical elements. Further, the optical assembly 1016 allows for the continuous exposure of two or more shots per scanning motion. With this exposure pattern, the reduction in scanning time is much greater than the increase in stepping time, and dramatic improvements in throughput are possible.

Table 1, as provided below, illustrates one, non-exclusive example of a prescription for the optic elements E1 through E46 of the optical assembly 1016 illustrated in FIG. 11. More particularly, for each optical element E1 through E46, the charts in Table 1 show a prescription for (i) the radius of curvature for the front of the optical element, (ii) the radius of curvature for the back of the optical element, (iii) the thickness of the optical element (in the column for thickness the top number represents the distance between that optical element and the preceding optical element (or the mask in the case of optical element E1), and the bottom number represents the actual thickness of that optical element, (iv) the aperture diameter for the front of the optical element, and (v) the aperture diameter for the back of the optical element.

TABLE 1

| ELEMENT NUMBER | RADIUS OF CURVATURE | | THICKNESS | APERTURE DIAMETER | |
|---|---|---|---|---|---|
| | FRONT | BACK | | FRONT | BACK |
| MASK | INF | | 80.0000 | | |
| E1 | 332.3631 CX | −772.3579 CX | 38.0763 | 215.2012 | 217.2506 |
| | | | 26.9220 | | |
| E2 | 1988.1790 CX | −557.1967 CX | 26.6978 | 220.9056 | 221.1825 |
| | | | 56.1372 | | |
| E3 | 128.4263 CX | A(1) | 31.0843 | 198.8483 | 187.8534 |
| | | | 26.0025 | | |
| E4 | 98.6558 CX | 321.1966 CC | 45.2849 | 159.9568 | 143.6474 |
| | | | 16.3918 | | |
| E5 | −454.4909 CC | −730.0124 CX | 59.9935 | 137.4985 | 118.9757 |
| | | | 59.7289 | | |
| E6 | −64.8711 CC | −199.1701 CX | 12.5000 | 125.5907 | 190.0548 |
| | | | 1.0877 | | |
| E7 | −224.3732 CC | −132.7050 CX | 46.3257 | 196.0660 | 217.1116 |
| | | | 1.0000 | | |
| E8 | A(2) | −158.7960 CX | 45.6873 | 245.0434 | 260.0687 |
| | | | 1.0000 | | |
| E9 | −646.1248 CC | −226.2058 CX | 51.0836 | 289.0873 | 295.5915 |
| | | | 1.0000 | | |
| E10 | 360.6986 CX | A(3) | 53.3734 | 287.2861 | 282.7083 |
| | | | 139.9997 | | |
| | | | | 211.4006 | |
| | | | 100.0000 | | |
| E11 | 237.9744 CX | −1445.3266 CX | 51.2169 | 244.1453 | 240.7614 |
| | | | 174.1733 | | |
| E12 | A(4) | 487.4478 CC | 12.5000 | 158.1046 | 166.9962 |
| | | | 58.1229 | | |
| E13 | −98.2161 CC | −210.5104 CX | 12.5000 | 168.7470 | 212.4076 |
| | | | 24.2148 | | |
| E14 | −145.6557 CC | | −24.2148 | 218.4194 | |
| E15 | −210.5104 CX | −98.2161 CC | −12.5000 | 209.9116 | 168.2949 |
| | | | −58.1229 | | |

TABLE 1-continued

| ELEMENT NUMBER | RADIUS OF CURVATURE FRONT | RADIUS OF CURVATURE BACK | THICKNESS | APERTURE DIAMETER FRONT | APERTURE DIAMETER BACK |
|---|---|---|---|---|---|
| E16 | 487.4478 CC | A(5) | −12.5000 | 166.3525 | 155.5700 |
|  |  |  | −174.1733 |  |  |
| E17 | −1445.3266 CX | 237.9744 CX | −51.2169 | 252.3990 | 255.2359 |
|  |  |  | −100.0000 |  |  |
|  | DECENTER(1) |  |  |  |  |
| E18 |  | INF | 0.0000 | 358.2570 |  |
|  |  |  |  | 230.1752 |  |
|  |  |  | 139.9999 |  |  |
| E19 | A(6) | −489.7915 CX | 48.1053 | 269.5593 | 273.1352 |
|  |  |  | 1.0509 |  |  |
| E20 | 440.2750 CX | −1319.4966 CX | 42.3662 | 278.5086 | 276.5223 |
|  |  |  | 1.0004 |  |  |
| E21 | 153.2021 CX | A(7) | 35.3619 | 249.4052 | 236.0525 |
|  |  |  | 1.0048 |  |  |
| E22 | 129.8182 CX | 247.8748 CC | 51.0939 | 218.2553 | 199.2937 |
|  |  |  | 14.1804 |  |  |
| E23 | 139.9820 CX | 69.7240 CC | 17.4815 | 161.4679 | 118.1128 |
|  |  |  | 56.7295 |  |  |
| E24 | −317.8201 CC | −19220.6836 CX | 12.5000 | 92.5138 | 103.8677 |
|  |  |  | 51.6277 |  |  |
| E25 | −239.6328 CC | −120.1306 CX | 53.8056 | 186.4776 | 208.1471 |
|  |  |  | 1.0000 |  |  |
| E26 | A(8) | −134.3606 CX | 57.5209 | 232.5554 | 249.2932 |
|  |  |  | 3.2068 |  |  |
| E27 | 3402.1195 CX | −375.2978 CX | 40.6273 | 270.0570 | 271.5381 |
|  |  |  | 9.9100 |  |  |
| E28 | 501.3345 CX | −4078.3847 CX | 31.4270 | 258.1145 | 253.6591 |
|  |  |  | 140.0003 |  |  |
|  | DECENTER(2) |  |  |  |  |
| E29 |  | INF | 0.0000 | 340.0505 |  |
|  |  |  |  | 167.4372 |  |
|  |  |  | −119.0000 |  |  |
| E30 | −725.7800 CX | 971.2181 CX | −26.7346 | 215.7113 | 218.7057 |
|  |  |  | −1.0000 |  |  |
| E31 | −246.2088 CX | −2291.7420 CC | −37.5566 | 227.3402 | 224.6272 |
|  |  |  | −1.0000 |  |  |
| E32 | −240.3807 CX | −491.2120 CC | −27.0952 | 217.7132 | 211.0205 |
|  |  |  | −1.0000 |  |  |
| E33 | −359.5177 CX | A(9) | −26.0330 | 208.1157 | 200.6343 |
|  |  |  | −2.5888 |  |  |
| E34 | 3436.6049 CC | −155.1981 CC | −12.5000 | 201.2703 | 181.4202 |
|  |  |  | −53.9084 |  |  |
| E35 | 201.2753 CC | A(10) | −12.5000 | 181.5783 | 206.3011 |
|  |  |  | −32.1960 |  |  |
| E36 | A(11) | 22055.3033 CX | −18.2557 | 222.3822 | 232.1830 |
|  |  |  | −5.7398 |  |  |
| E37 | −444.9630 CX | 855.8885 CX | −44.4071 | 269.0140 | 274.6713 |
|  |  |  | −1.0250 |  |  |
| E38 | −1241.2380 CX | A(12) | −48.8825 | 285.3656 | 288.3814 |
|  |  |  | 4.0469 |  |  |
| E39 | 505.0198 CC | A(13) | −19.5442 | 288.9709 | 293.2339 |
|  |  |  | −27.7418 |  |  |
| E40 | A(14) | 300.9422 CX | −54.8835 | 293.3251 | 329.7481 |
|  |  |  | −1.0029 |  |  |
| E41 | −384.4074 CX | 1165.4799 CX | −69.9286 | 356.7095 | 354.3822 |
|  |  |  | −1.0000 |  |  |
|  |  |  |  | 347.3775 |  |
|  |  |  | −1.0000 |  |  |
|  |  | APERTURE STOP |  | 313.1895 |  |
| E42 | −192.8071 CX | −336.3459 CC | −57.1654 | 313.1895 | 301.4309 |
|  |  |  | −1.0015 |  |  |
| E43 | −146.6712 CX | A(15) | −63.7532 | 260.7714 | 240.3029 |
|  |  |  | −1.2011 |  |  |
| E44 | −93.7790 CX | A(16) | −53.0084 | 174.6861 | 139.7743 |
|  |  |  | −1.0108 |  |  |
| E45 | −64.9508 CX | INF | −44.5062 | 105.4047 | 44.5875 |
| E46 | INF | INF | −1.5000 | 44.5875 | 36.2567 |
|  | SUBSTRATE | INF |  | 36.2567 |  |

In Table 1, it should be noted that (i) positive radius indicates the center of curvature is to the right; (ii) negative radius indicates the center of curvature is to the left; (iii) dimensions are given in millimeters; (iv) thickness is axial distance to next surface; and (v) image diameter shown above is a paraxial value, and is not a ray traced value.

Table 2, as provided below, illustrates the calculation of aspheric constants related to the radius of curvature for certain of the optical elements as shown in Table 1. More particularly, aspheric constant A(1) relates to the radius of curvature for the back of optical element E3; aspheric constant A(2) relates to the radius of curvature for the front of optical element E8; aspheric constant A(3) relates to the radius of curvature for the back of optical element E10; aspheric constant A(4) relates to the radius of curvature for the front of optical element E12; aspheric constant A(5) relates to the radius of curvature for the back of optical element E16; aspheric constant A(6) relates to the radius of curvature for the front of optical element E19; aspheric constant A(7) relates to the radius of curvature for the back of optical element E21; aspheric constant A(8) relates to the radius of curvature for the front of optical element E26; aspheric constant A(9) relates to the radius of curvature for the back of optical element E33; aspheric constant A(10) relates to the radius of curvature for the back of optical element E35; aspheric constant A(11) relates to the radius of curvature for the front of optical element E36; aspheric constant A(12) relates to the radius of curvature for the back of optical element E38; aspheric constant A(13) relates to the radius of curvature for the back of optical element E39; aspheric constant A(14) relates to the radius of curvature for the front of optical element E40; aspheric constant A(15) relates to the radius of curvature for the back of optical element E43; and aspheric constant A(16) relates to the radius of curvature for the back of optical element E44.

Additionally, within the formula for the aspheric constants, Y represents the distance from the optical axis (i.e., the first inlet axis, a first transverse axis, or the outlet axis), CURV represents (1/radius of curvature), and K represents the conic constant.

TABLE 2

ASPHERIC CONSTANTS $$Z = \frac{(CURV)Y^2}{1 + (1 - (1 + K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC | CURV | K / E | A / F | B / G | C / H | D / J |
|---|---|---|---|---|---|---|
| A(1) | 0.00521230 | 0.000000 | 7.36515E−08 | 5.65704E−12 | −1.19986E−15 | 3.47493E−20 |
|  |  | 1.94010E−24 | −2.67446E−28 | 0.00000E+00 | 0.00000E+00 | 0.00000E+00 |
| A(2) | −0.00474024 | 0.000000 | 1.94442E−08 | 7.19217E−13 | −4.39422E−17 | −8.49737E−22 |
|  |  | 1.08518E−25 | −2.62326E−30 | 0.00000E+00 | 0.00000E+00 | 0.00000E+00 |
| A(3) | −0.00181913 | 0.000000 | 1.97669E−08 | −2.81921E−14 | −2.03611E−18 | 3.92721E−23 |
|  |  | 8.64464E−29 | −2.01755E−32 | 0.00000E+00 | 0.00000E+00 | 0.00000E+00 |
| A(4) | −0.00943927 | 0.000000 | 4.03091E−07 | −1.84915E−11 | 3.06102E−16 | −5.60022E−20 |
|  |  | 9.77410E−24 | −1.64771E−27 | 0.00000E+00 | 0.00000E+00 | 0.00000E+00 |
| A(5) | −0.00943927 | 0.000000 | 1.22035E−07 | 1.75899E−12 | −8.89537E−18 | 2.56518E−20 |
|  |  | −1.72833E−24 | 2.12380E−28 | 0.00000E+00 | 0.00000E+00 | 0.00000E+00 |
| A(6) | 0.00250445 | 0.000000 | −2.24797E−08 | −1.71809E−14 | 4.18962E−18 | −1.25992E−22 |
|  |  | 1.93598E−27 | −1.52571E−32 | 0.00000E+00 | 0.00000E+00 | 0.00000E+00 |
| A(7) | 0.00598617 | 0.000000 | −1.78129E−08 | −1.34754E−12 | −9.63168E−18 | −5.96286E−22 |
|  |  | 8.22593E−26 | −3.07075E−30 | 0.00000E+00 | 0.00000E+00 | 0.00000E+00 |
| A(8) | −0.00402385 | 0.000000 | −5.66102E−08 | 4.94563E−13 | −2.86196E−17 | −1.14660E−21 |
|  |  | 6.70516E−26 | −1.34290E−30 | 0.00000E+00 | 0.00000E+00 | 0.00000E+00 |
| A(9) | 0.00043217 | 0.000000 | −4.01551E−08 | 7.98475E−13 | −8.77129E−17 | −1.03388E−21 |
|  |  | 5.28663E−25 | −4.41691E−29 | 6.99988E−34 | 0.00000E+00 | 0.00000E+00 |
| A(10) | −0.00708334 | 0.000000 | 1.59565E−07 | −5.12216E−12 | 3.09234E−16 | −1.36558E−20 |
|  |  | 6.81623E−25 | −9.67188E−30 | −7.26516E−35 | 0.00000E+00 | 0.00000E+00 |
| A(11) | −0.00159664 | 0.000000 | 8.79056E−08 | −4.58660E−12 | 1.44100E−16 | −1.79547E−20 |
|  |  | 4.80695E−25 | −2.72623E−29 | 1.93370E−33 | 0.00000E+00 | 0.00000E+00 |
| A(12) | 0.00262213 | 0.000000 | 1.87932E−08 | 7.71419E−13 | −1.47309E−16 | 3.46140E−21 |
|  |  | 1.30616E−25 | −1.07939E−29 | 1.84543E−34 | 0.00000E+00 | 0.00000E+00 |
| A(13) | 0.00317050 | 0.000000 | −2.49489E−08 | −8.47598E−13 | 1.17616E−16 | −3.41773E−21 |
|  |  | −1.01449E−25 | 8.58972E−30 | −1.27042E−34 | 0.00000E+00 | 0.00000E+00 |
| A(14) | 0.00395847 | 0.000000 | 6.54729E−09 | 3.01118E−13 | 1.06282E−17 | −1.83601E−21 |
|  |  | 1.35202E−25 | −5.49884E−30 | 9.45241E−35 | 0.00000E+00 | 0.00000E+00 |
| A(15) | −0.00373059 | 0.000000 | 2.81186E−08 | −3.40496E−12 | 1.73002E−16 | −4.39804E−21 |
|  |  | −1.60826E−25 | 1.48359E−29 | −3.52669E−34 | 0.00000E+00 | 0.00000E+00 |
| A(16) | −0.00548781 | 0.000000 | −1.89752E−07 | −2.61284E−13 | −1.75568E−15 | 2.78432E−20 |
|  |  | 2.85207E−23 | −8.14237E−27 | 5.98295E−31 | 0.00000E+00 | 0.00000E+00 |

Table 3, as provided below, illustrates the decentering information as it relates to optical elements E18 and E29 (i.e., certain of the mirror elements). Table 3 further provides additional system characteristics for the optical assembly 1120.

TABLE 3

DECENTERING CONSTANTS

| DECENTER | X | Y | Z | ALPHA | BETA | GAMMA |
|---|---|---|---|---|---|---|
| D(1) | 0.0000 | 0.0000 | 0.0000 | −45.0000 | 0.0000 | 0.0000 (BEND) |
| D(2) | 0.0000 | 0.0000 | 0.0000 | −45.0000 | 0.0000 | 0.0000 (BEND) |

TABLE 3-continued

DECENTERING CONSTANTS

A decenter defines a new coordinate system (displaced and/or rotated) in which subsequent surfaces are defined. Surfaces following a decenter are aligned on the local mechanical axis (z-axis) of the new coordinate system. The new mechanical axis remains in use until changed by another decenter. The order in which displacements and tilts are applied on a given surface is specified using different decenter types and these generate different new coordinate systems; those used here are explained below. Alpha, beta, and gamma are in degrees.

DECENTERING CONSTANT KEY:

| TYPE | TRAILING CODE | ORDER OF APPLICATION |
|---|---|---|
| DECENTER | | DISPLACE (X, Y, Z) |
| | | TILT (ALPHA, BETA, GAMMA) |
| | | REFRACT AT SURFACE |
| | | THICKNESS TO NEXT SURFACE |
| DECENTER & BEND | BEND   DECENTER | |
| (X, Y, Z, ALPHA, BETA, GAMMA) | | REFLECT AT SURFACE |
| | | BEND (ALPHA, BETA, GAMMA) |
| | | THICKNESS TO NEXT SURFACE |

REFERENCE WAVELENGTH = 193.3 NM
SPECTRAL REGION = 193.3 - 193.3 NM
This is a non-symmetric system. If elements with power are decentered or tilted, the first order properties are probably inadequate in describing the system characteristics.
INFINITE CONJUGATES EFL = 8645.9595
BFL = 2159.9899
FFL = 23989.7701
F/NO = 0.0000
AT USED CONJUGATES REDUCTION = −0.2500
FINITE F/NO = −0.3704
OBJECT DIST = 80.0000
TOTAL TRACK = 763.7529
IMAGE DIST = −1.5000
OAL = 685.2529
PARAXIAL

IMAGE HT = 18.1250
IMAGE DIST = −1.5000
SEMI-FIELD

ANGLE = 0.0000
ENTR PUPIL

DIAMETER = 0.717E+10
DISTANCE = 0.100E+11
EXIT PUPIL

DIAMETER = 4314.9615
DISTANCE = 2159.9951

NOTES
FFL is measured from the first surface
BFL is measured from the last surface It should be noted that the projection optical assembly 1116 provided herein is uniquely designed so that a plurality of intermediate images are directed at the field splitting V-mirror E-29 inside the projection optical assembly 1116. Stated in another fashion, with the present design, the field splitting V-mirror E-29 is positioned away from the image plane of the optical assembly 1116. As used herein, the term "image plane" shall mean the plane in which an image produced by the optical assembly is formed. With the present design, the image plane of the optical assembly 1116 is located at the substrate. Thus, in FIG. 11, elements E-30 through E-46 separate the field splitting V-mirror E-29 from the image plane. With the present design, many aberrated images are transmitted through elements E-30-E-46. The aberrated images give the optical designer much more flexibility in balancing aberrations before and after the V-mirror E-29. This also enables the larger field size for scanning along the short dimension of the site (X axis scan), without a larger and more complicated optical design.

Additionally, in the embodiment illustrated in FIG. 11, the projection optical assembly 1116 is a Catadioptric design that includes one or more lenses and one or more curved mirrors. In this embodiment, the projection optical assembly 1116 includes at least one concave mirror (e.g. E14 for each optical path), for the purposes of field curvature correction over the large field size of 33 mm. It is conceivable that the projection optical assembly 1116 can be designed with more than one curved mirror per optical path.

Further with the projection optical assembly 1116 provided herein, the fold mirror E18 allows light to be incident on, and reflected from, the concave mirror E14 without obscuration. The fold direction is in the short direction of the field (e.g. 5 mm at the wafer), and it is close to a second intermediate image (FIG. 11 illustrates the rays coming to a focus right next to E18, as they do next to E29). This facilitates the folding arrangement at E18, in the same way that it does at the V-mirror E29.

Additionally, it should be noted that the projection optical assembly 1116 illustrated and described herein is a 4× reduction system that reduces the size of the projected image between elements E1 and E45. Alternatively, the projection optical assembly 1116 can be designed to be a 1× system, a magnification system, or a reduction system that is greater than or less than 4×.

Figure 12:
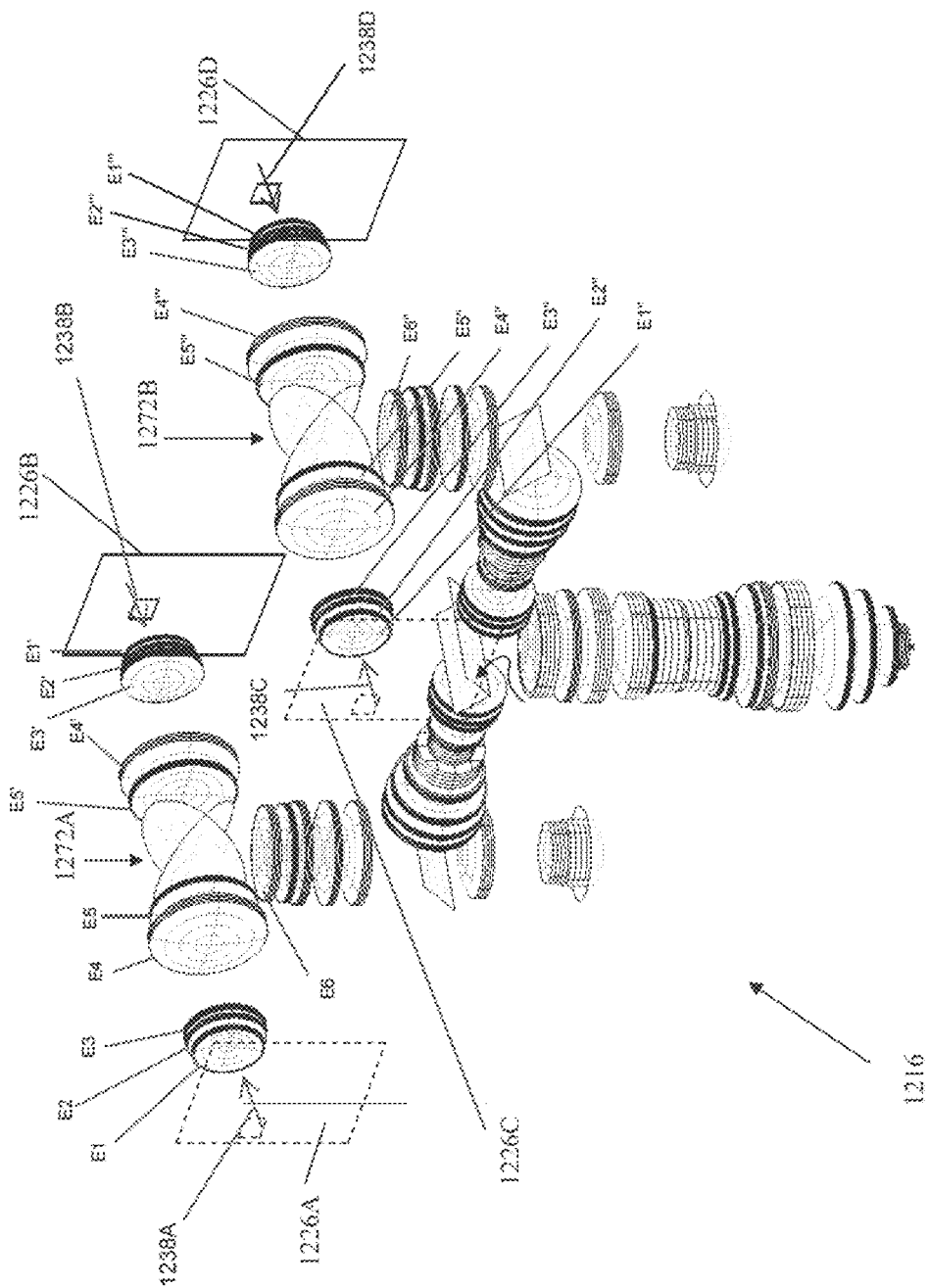
FIG. 12 is a simplified perspective view of portion of another embodiment of an exposure apparatus having features of the present invention.

FIG. 12 is a simplified perspective view of another embodiment that includes, a first mask 1226A, a second mask 1226B, a third mask 1226C, a fourth mask 1226D, and another embodiment of an optical assembly 1216 having features of the present invention. In this embodiment, the optical assembly 1216 projects and/or focuses a first pattern beam 1238A from the first mask 1226A, a second pattern beam 1238B from the second mask 26B, a third pattern beam 1238C from the third mask 1226C, and a fourth pattern beam 1238D from the fourth mask 1226D onto the substrate 28 (illustrated in FIG. 1A).

In this embodiment, the masks 1226A-1226D can be individually positioned and individually illuminated, and the substrate can be positioned with components that somewhat similar to those described above and illustrated in FIG. 1A.

On embodiment of a four mask exposure apparatus is disclosed in concurrently filed application Ser. No. 12/481,124, filed on Jun. 9, 2009, entitled "Optical Imaging System and Method for Imaging Up to Four Reticles to a Single Imaging Location", which is assigned to the assignee of the present invention, and is incorporated by reference herein, as far as permitted.

The design of the optical assembly 1216 can be varied depending on the requirements of the exposure apparatus 10 (illustrated in FIG. 1A). As illustrated, the optical assembly 1016 is substantially similar to the optical assembly 1016 illustrated in FIG. 10. For example, the design, positioning and orientation of optical elements E6 through E46 (the immersion fluid is not shown in FIG. 12) is substantially repeated in this embodiment. Accordingly, a detailed description that portion of the optical assembly 1216 will not be repeated herein. However, the optical assembly 1216, as illustrated in the embodiment shown in FIG. 12, includes (i) optical elements E1 through E5, which are positioned substantially between the first mask 1226A and optical element E6 and are oriented substantially transversely relative to optical element E6, (ii) optical elements E1' through E5', which are positioned substantially between the second mask 1226B and optical element E6 and are oriented substantially transversely relative to optical element E6, (iii) optical elements E1" through E5", which are positioned substantially between the third mask 1226C and optical element E6" and are oriented substantially transversely relative to optical element E6", and (iv) optical elements E1''' through E5''', which are positioned substantially between the fourth mask 1226D and optical element E6" and are oriented substantially transversely relative to optical element E6".

Additionally, the optical assembly 1216 further includes a first switching mirror 1272A that is positioned substantially between optical elements E5 and E6 and between optical elements E5' and E6, and a second switching mirror 1272B that is positioned substantially between optical elements E5" and E6" and between optical elements E5''' and E6" on the opposite side of the optical assembly 1216. The first switching mirror 1272A enables the optical assembly 1216 to selectively, alternatively and/or sequentially project and/or focus the first pattern beam 1238A from the first mask 1226A onto the substrate 28, and the second pattern beam 1238B from the second mask 1226B onto the substrate 28. Similarly, the second switching mirror 1272B enables the optical assembly 1216 to selectively, alternatively and/or sequentially project and/or focus the third pattern beam 1238C from the third mask 1226C onto the substrate 28, and the fourth pattern beam 1238D from the fourth mask 1226D onto the substrate 28.

Figure 13:
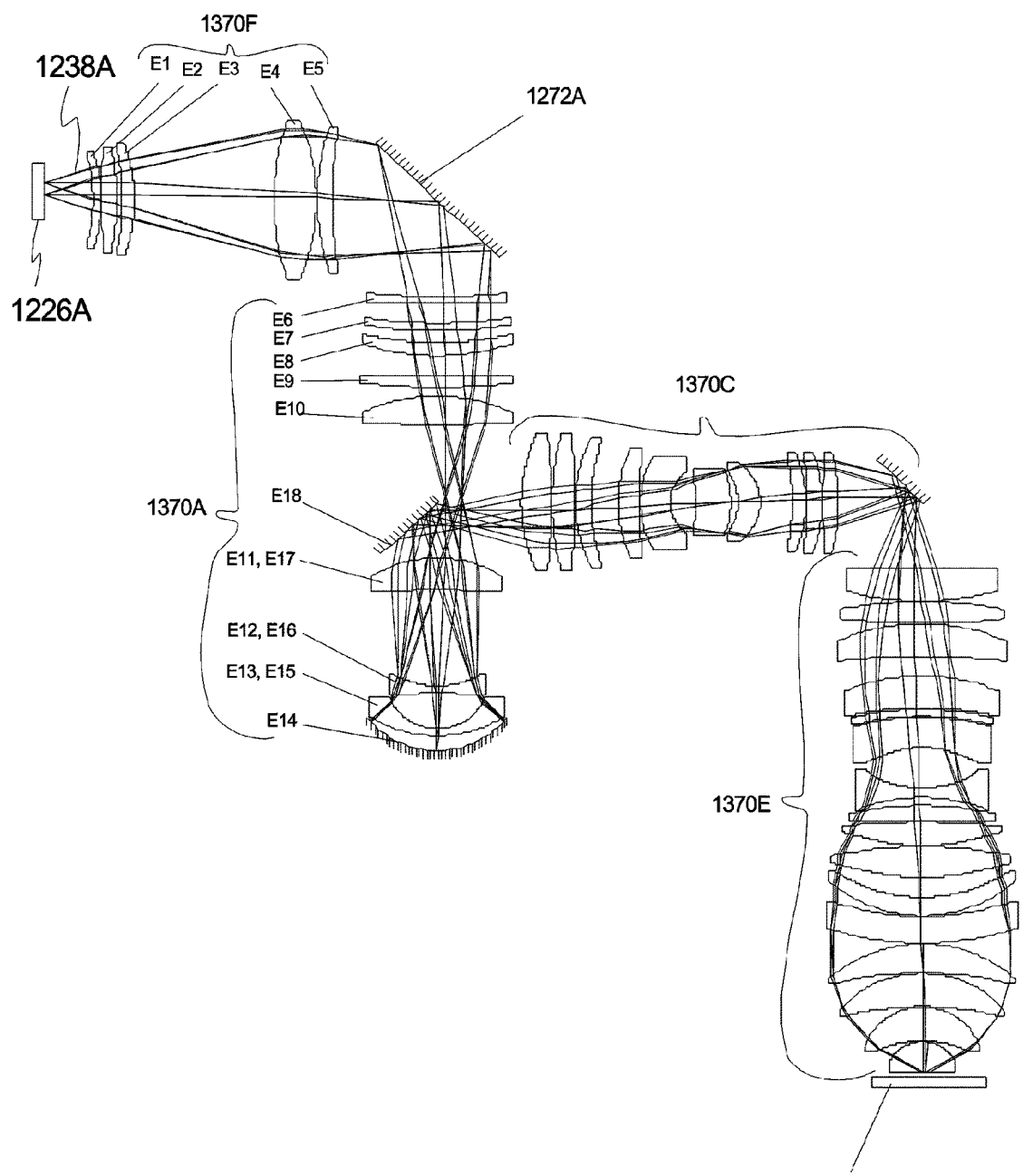
FIG. 13 is a simplified side view of the first mask, the substrate, and a portion of the optical assembly illustrated in FIG. 12.

The process of the optical assembly 1216 projecting and/or focusing the first pattern beam 1238A from the first mask 1226A onto the substrate 28 is substantially similar to the projecting and/or focusing of the second pattern beam 1238B from the second mask 1226B, the third pattern beam 1238C from the third mask 1226C, and/or the fourth pattern beam 1238D from the fourth mask 1226D onto the substrate 28. Accordingly, FIG. 13 is a simplified side view of the first mask 1226A, the substrate 28, and a portion of the optical assembly 1216 illustrated in FIG. 12. More particularly, FIG. 13 illustrates the projecting and/or focusing of the first pattern beam 1238A from the first mask 1226A onto the substrate 28.

During projection and/or focusing of the first pattern beam 1238A from the first mask 1226A onto the substrate 28, the first pattern beam 1238A is initially directed toward a plurality of initiating transverse optical elements 1370F (i.e., optical elements E1 through E5). Subsequently, the first pattern beam 1238A is redirected by the first switching mirror 1272A toward the plurality of first vertical optical elements 1370A (i.e., optical elements E6 through E18). Next, the first pattern beam 1238A is redirected toward the plurality of first transverse optical elements 1370C. Then, the first pattern beam 1238A is redirected toward the plurality of third vertical optical elements 1370E. The third vertical optical elements 1370E then project and/or focus the first pattern beam toward the substrate 28.

Figure 14A:
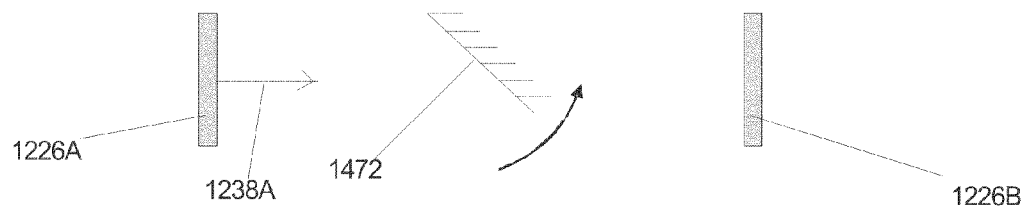
FIGS. 14A and 14B illustrate the first mask, the second mask, and an embodiment of a switching mirror usable with the present invention.
Figure 14B:
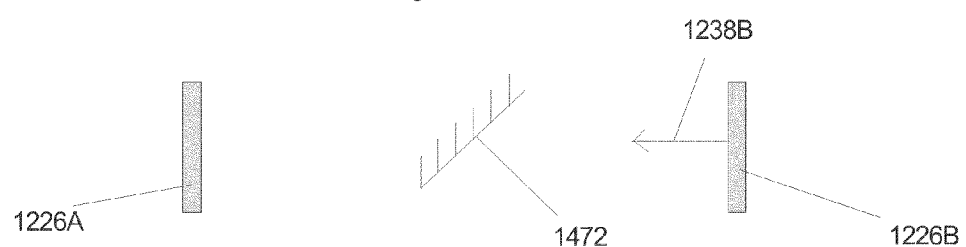

FIGS. 14A and 14B illustrate the first mask 1226A, the second mask 1226B, and an embodiment of a switching mirror 1472 usable with the present invention. In this embodiment, the switching mirror 1472 is a single mirror that rotates by approximately 90 degrees in order to switch orientation between the first mask 1226A and the second mask 1226B. More particularly, in FIG. 14A the switching mirror 1472 is oriented so that it can reflect and redirect the first pattern beam 1238A from the first mask 1226A as described in greater detail above. Additionally, in FIG. 14B the switching mirror 1472 has been rotated by an actuator (not shown) approximately 90 degrees so that it is now oriented so that it can reflect and redirect the second pattern beam 1238B from the second mask 1226B.

Figure 15A:
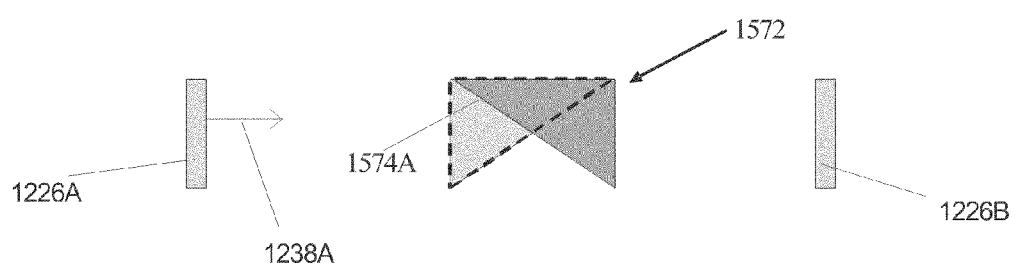
FIGS. 15A and 15B illustrate the first mask, the second mask, and another embodiment of a switching mirror usable with the present invention.
Figure 15B:
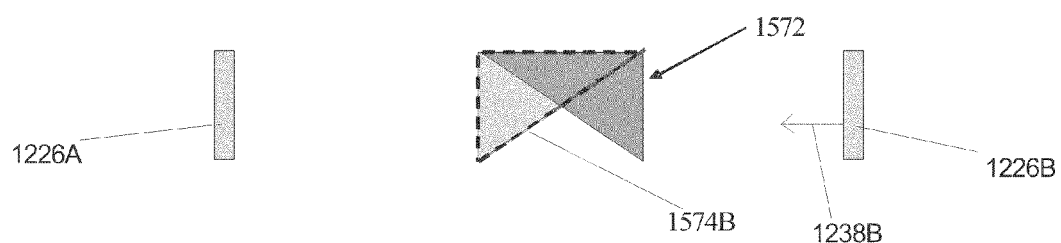

FIGS. 15A and 15B illustrate the first mask 1226A, the second mask 1226B, and another embodiment of a switching mirror 1572 usable with the present invention. In this embodiment, the switching mirror 1572 includes a two prism arrangement, in which there are two mirror surfaces 1574A, 1574B on the hypotenuse of each triangle of the figures, wherein the mirror surfaces 1574A, 1574B are oriented at 90 degrees relative to each other. The switching mirror 1572 can be moved in and out of the page with an actuator (not shown) in order to change the orientation of the mirror surfaces 1574A, 1574B so that the switching mirror 1572 can alternatively reflect the first pattern beam 1238A from the first mask 1226A (as illustrated in FIG. 15A) or the second pattern beam 1238B from the second mask 1226B (as illustrated in FIG. 15B).

Figure 16:
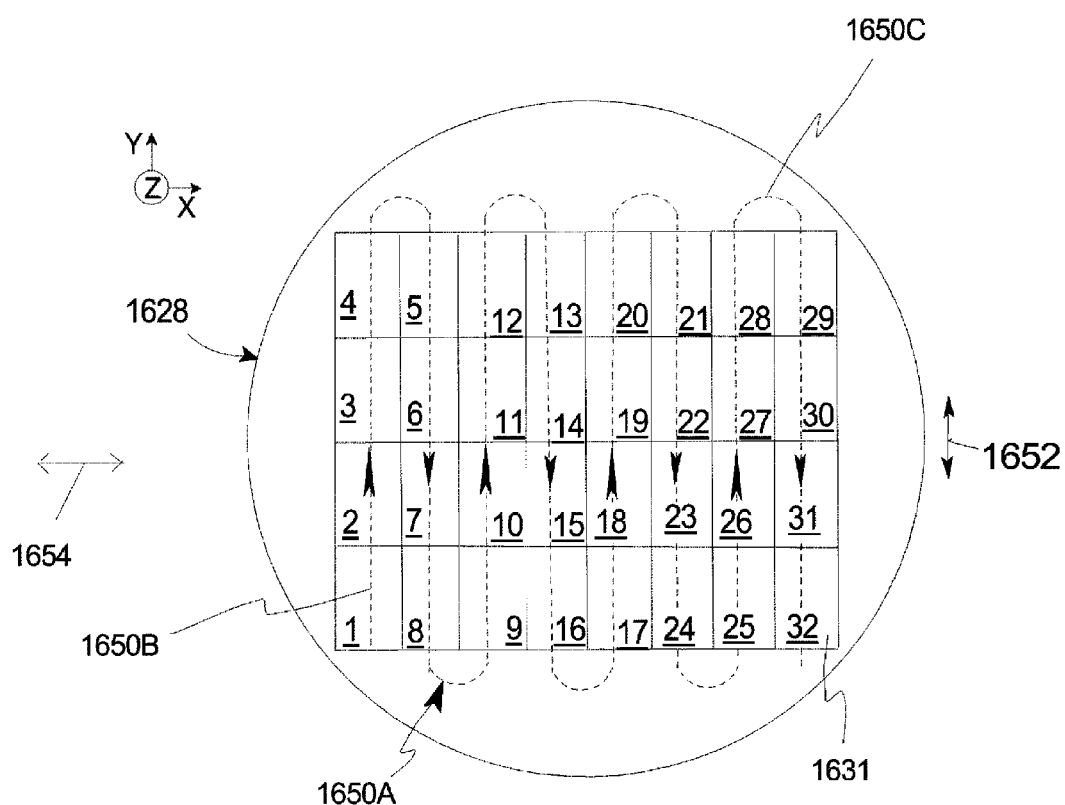
FIG. 16 is a simplified top view of an embodiment of a substrate exposed utilizing the optical assembly illustrated in FIG. 12.

FIG. 16 is a simplified top view of one non-exclusive embodiment of a substrate 1628 that was exposed utilizing the four mask design and the optical assembly 1216 illustrated in FIG. 12. The design of the substrate 1628 is similar to the substrate 228A described above and illustrated in FIG. 2A. However, in FIG. 16, the sequence in which the sites 1631 are exposed is different.

In this embodiment, the substrate 1628 is again labeled "1" through "32" (one through thirty-two). In this example, the labels "1" through "32" represent one non-exclusive embodiment of the sequence in which mask patterns from each of the first mask 1226A, the second mask 1226B, the third mask 1226C and the fourth mask 1226D (illustrated In FIG. 12) can be transferred to the sites 1631 on the substrate 1628.

Moreover, FIG. 16 includes an exposure pattern 1650A (illustrated with a dashed line) which further illustrates the order in which the mask patterns are transferred to sites 1631. In this example, the exposure pattern 1650A comprises a plurality of scanning operations 1650B and a plurality of stepping operations 1650C, wherein the scanning operations 1650B and the stepping operations 1650C alternate so that the exposure proceeds in a scan-step-scan-step-scan fashion. In this embodiment, the scanning 1650B occurs as the substrate 1628 is moved along a scan axis 1652 (the Y axis), and the stepping 1650C occurs as the substrate 1628 is moved along a step axis 1654 (the X axis).

In this embodiment, because four individual masks 1226A, 1226B, 1226C, 1226D are utilized, four adjacent sites 1631 (e.g. 1, 2, 3 and 4) can be scanned sequentially while moving the substrate 1628 at a constant velocity along the scan axis 1652. As a result thereof, the substrate 1628 does not have to be stepped and reversed in direction between the exposures of the sites 1631. Instead, for the embodiment illustrated in FIG. 12, the substrate 1628 is only stepped between the exposure of sets of four adjacent sites 1631 aligned on the scan axis 1652. Stated in another fashion, with the present design, there is one stepping motion for every four sites 1631 scanned. This results in fewer steps and significantly improved throughput from the exposure apparatus 10 (illustrated in FIG. 1A).

It should be noted that in this example, the site 1631 that is exposed first and the order in which the sites 1631 are exposed can be different than that illustrated in FIG. 16. Further, the site 1631 that is first exposed can be located away from the edge of the substrate 1628.

Figure 17A:
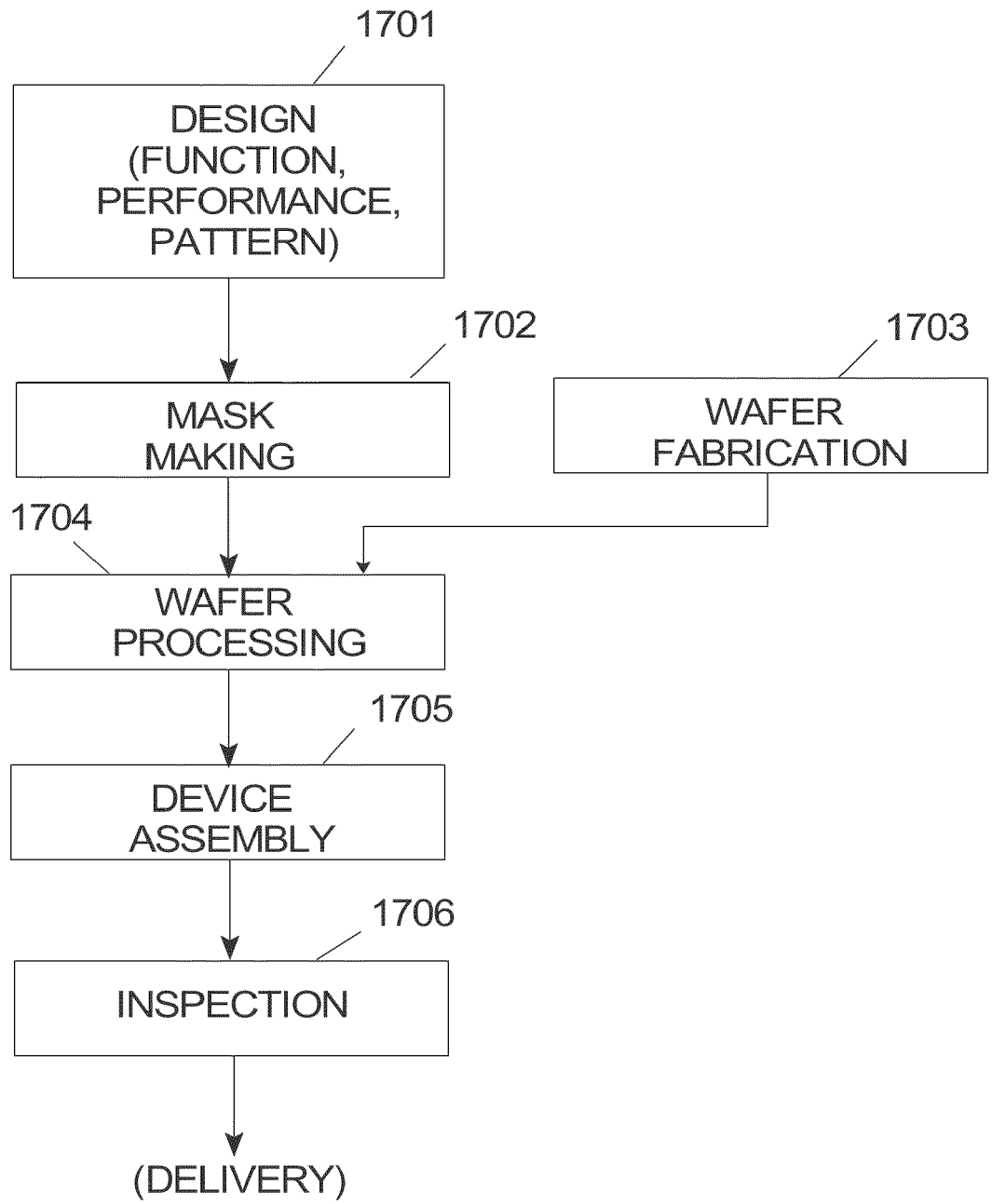
FIG. 17A is a flow chart that outlines a process for manufacturing a device in accordance with the present invention.

Semiconductor devices can be fabricated using the above described systems, by the process shown generally in FIG. 17A. In step 1701 the device's function and performance characteristics are designed. Next, in step 1702, a mask (reticle) having a pattern is designed according to the previous designing step, and in a parallel step 1703 a wafer is made from a silicon material. The mask pattern designed in step 1702 is exposed onto the wafer from step 1703 in step 1704 by a photolithography system described hereinabove in accordance with the present invention. In step 1705, the semiconductor device is assembled (including the dicing process, bonding process and packaging process), finally, the device is then inspected in step 1706.

Figure 17B:
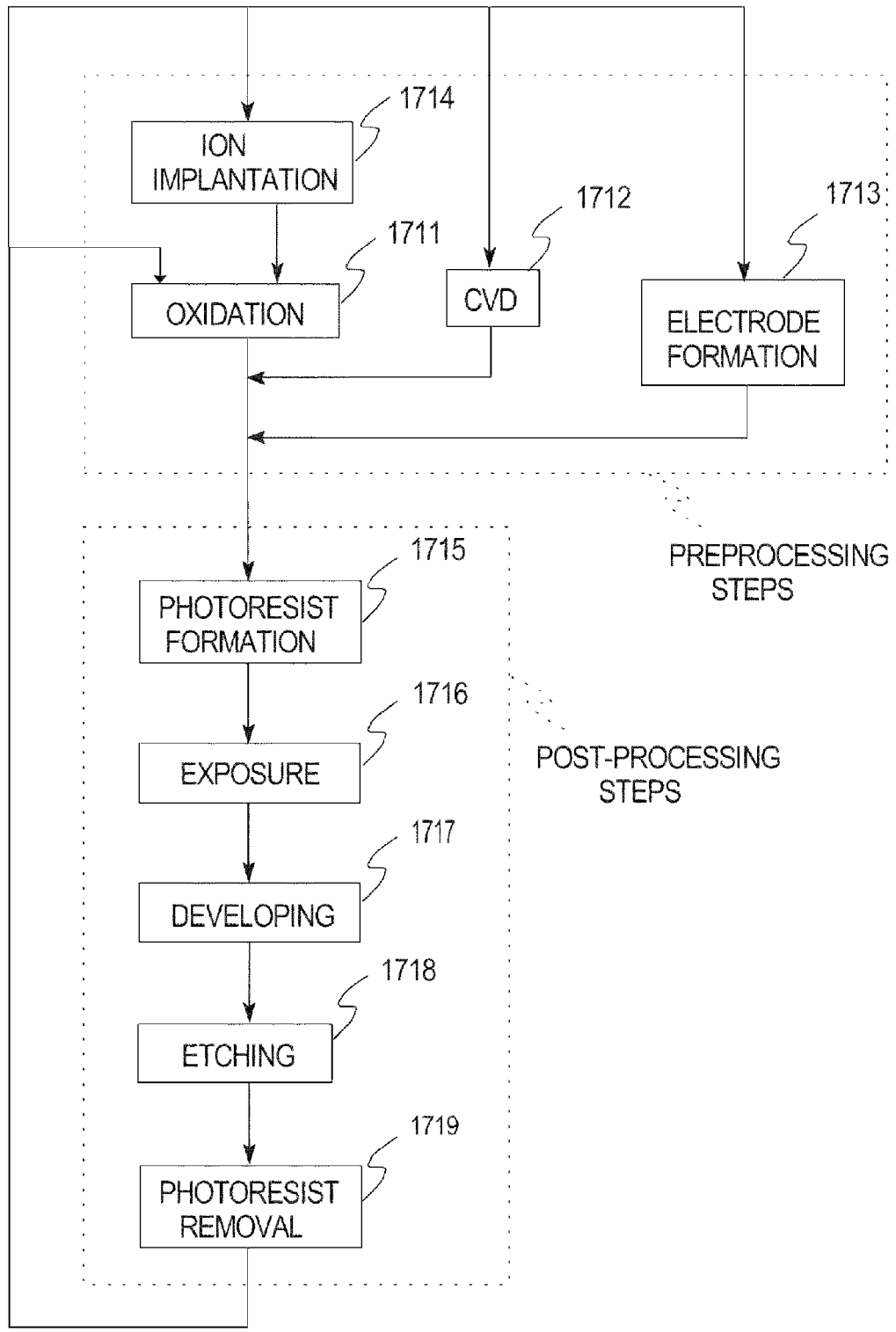
FIG. 17B is a flow chart that outlines device processing in more detail.

FIG. 17B illustrates a detailed flowchart example of the above-mentioned step 1704 in the case of fabricating semiconductor devices. In FIG. 17B, in step 1711 (oxidation step), the wafer surface is oxidized. In step 1712 (CVD step), an insulation film is formed on the wafer surface. In step 1713 (electrode formation step), electrodes are formed on the wafer by vapor deposition. In step 1714 (ion implantation step), ions are implanted in the wafer. The above mentioned steps 1711-1714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1715 (photoresist formation step), photoresist is applied to a wafer. Next, in step 1716 (exposure step), the above-mentioned exposure device is used to transfer the circuit pattern of a mask (reticle) to a wafer. Then in step 1717 (developing step), the exposed wafer is developed, and in step 1718 (etching step), parts other than residual photoresist (exposed material surface) are removed by etching. In step 1718 (photoresist removal step), unnecessary photoresist remaining after etching is removed. Multiple circuit patterns are formed by repetition of these preprocessing and post-processing steps.

It is to be understood that exposure apparatuses 10 disclosed herein are merely illustrative of the presently preferred embodiments of the invention and that no limitations are intended to the details of construction or design herein shown other than as described in the appended claims.

What is claimed is:

1. An exposure apparatus for transferring a first mask pattern from a first mask and a second mask pattern from a second mask to a substrate, the substrate including a first site and a second site that are aligned along a scan axis, the exposure apparatus comprising:
a first mask stage assembly that positions the first mask;
a second mask stage assembly that positions the second mask;
an illumination system that selectively generates a first illumination beam that is directed at the first mask to generate a first pattern beam, and a second illumination beam that is directed at the second mask to generate a second pattern beam;
a substrate stage assembly that positions the substrate; and
an optical assembly that directs the first pattern beam and the second pattern beam at the substrate, the optical assembly having a field of view that defines a first used field having a first field dimension that is at least approximately thirty-three millimeters, and the optical assembly having a numerical aperture of at least approximately 1.30.

2. The exposure apparatus of claim 1 wherein the optical assembly includes a first optical inlet that receives the first pattern beam, and a spaced apart second optical inlet that receives the second pattern beam.

3. The exposure apparatus of claim 2 wherein the optical assembly includes an optical outlet that directs both the first pattern beam and the second pattern beam at the substrate.

4. The exposure apparatus of claim 1 wherein the optical assembly includes an optical outlet and the field of view having the first used field and a spaced apart second used field, wherein the first pattern beam exits the optical outlet at the first used field, and wherein the second pattern beam exits the optical outlet at the second used field.

5. The exposure apparatus of claim 4 wherein the field of view includes a field axis and wherein the used fields are positioned on opposite sides of the field axis.

6. The exposure apparatus of claim 1 further comprising a control system that controls the first mask stage assembly, the second mask stage assembly, the illumination system, and the substrate stage assembly so that the first mask pattern is transferred to the first site and the second mask pattern is transferred to the second site in sequential order.

7. The exposure apparatus of claim 1 further comprising a control system that controls the first mask stage assembly, the second mask stage assembly, the illumination system, and the substrate stage assembly so that the first mask pattern is transferred to the first site and the second mask pattern is transferred to the second site while the substrate is being moved at a substantially constant velocity along the scan axis.

8. The exposure apparatus of claim 1 further comprising a control system that controls the first mask stage assembly, the second mask stage assembly, the illumination system, and the substrate stage assembly so that the first pattern beam is directed at the first site and the second pattern beam is directed at the second site at approximately the same time.

9. The exposure apparatus of claim 1 wherein the first illumination beam has a first polarization and the second illumination beam has a second polarization that is different than the first polarization.

10. The exposure apparatus of claim 9 wherein the first mask pattern includes features that are aligned along a first axis, and the second mask pattern includes features that are aligned along a second axis.

11. The exposure apparatus of claim 1 further comprising a third mask stage assembly that positions a third mask, wherein the illumination system selectively generates a third illumination beam that is directed at the third mask to generate a third pattern beam, and wherein the optical assembly focuses the third pattern beam onto the substrate.

12. The exposure apparatus of claim 11 wherein the optical assembly includes a first optical inlet that receives the first pattern beam and the third pattern beam, and a spaced apart second optical inlet that receives the second pattern beam.

13. The exposure apparatus of claim 11 further comprising a control system that controls the first mask stage assembly, the second mask stage assembly, the third mask stage assembly, the illumination system, and the substrate stage assembly so that the first mask pattern is transferred to the first site, the second mask pattern is transferred to the second site, and the third mask pattern is transferred to a third site while the substrate is being moved at a substantially constant velocity along the scan axis.

14. A process for manufacturing a device that includes the steps of providing a substrate and transferring a first mask pattern and a second mask pattern to the substrate with the exposure apparatus of claim 1.

15. A method for transferring a first mask pattern from a first mask and a second mask pattern from a second mask to a substrate, the substrate including a first site and a second site that are aligned along a scan axis, the method comprising the steps of:
  positioning the first mask with a first mask stage assembly;
  positioning the second mask with a second mask stage assembly;
  selectively generating a first illumination beam that is directed at the first mask to generate a first pattern beam and a second illumination beam that is directed at the second mask to generate a second pattern beam with an illumination system;
  positioning the substrate with a substrate stage assembly; and
  directing the first pattern beam and the second pattern beam at the substrate with an optical assembly, the optical assembly having a field of view that defines a first used field having a first field dimension that is at least approximately thirty-three millimeters, and the optical assembly having a numerical aperture of at least approximately 1.30.

16. The method of claim 15 wherein the step of selectively generating includes the steps of generating the first illumination beam with a first illumination source, and generating the second illumination beam with a second illumination source.

17. The method of claim 15 wherein the step of directing includes the optical assembly having a first optical inlet and a spaced apart second optical inlet, and further comprising the steps of the optical assembly receiving the first pattern beam through the first optical inlet, and the optical assembly receiving the second pattern beam through the second optical inlet.

18. The method of claim 17 wherein the step of directing further includes the steps of the optical assembly having an optical outlet, and directing both the first pattern beam and the second pattern beam at the substrate through the optical outlet.

19. The method of claim 15 wherein the step of directing includes the optical assembly including an optical outlet and the field of view having the first used field and a spaced apart second used field, wherein the first pattern beam exits the optical outlet at the first used field, and wherein the second pattern beam exits the optical outlet at the second used field.

20. The method of claim 19 wherein the step of directing includes the field of view having a field axis, and wherein the used fields are positioned on opposite sides of the field axis.

21. The method of claim 15 further comprising the step of controlling the first mask stage assembly, the second mask stage assembly, the illumination system, and the substrate stage assembly with a control system so that the first mask pattern is transferred to the first site and the second mask pattern is transferred to the second site in sequential order.

22. The method of claim 15 further comprising the step of controlling the first mask stage assembly, the second mask stage assembly, the illumination system, and the substrate stage assembly a control system so that the first mask pattern is transferred to the first site and the second mask pattern is transferred to the second site while the substrate is being moved at a substantially constant velocity along the scan axis.

23. The method of claim 15 further comprising the step of controlling the first mask stage assembly, the second mask stage assembly, the illumination system, and the substrate stage assembly a control system so that the first pattern beam is directed at the first site and the second pattern beam is directed at the second site at approximately the same time.

24. The method of claim 15 wherein the step of selectively generating includes the steps of generating the first illumination beam having a first polarization and generating the second illumination beam having a second polarization that is different than the first polarization.

25. The method of claim 15 further comprising the step of positioning a third mask with a third mask stage assembly, wherein the step of selectively generating includes the step of generating a third illumination beam that is directed at the third mask to generate a third pattern beam with the illumination system, and wherein the step of directing includes the step of directing the third pattern beam onto the substrate with the optical assembly.

26. The method of claim 25 wherein the step of directing includes the optical assembly having a first optical inlet and a spaced apart second optical inlet, and further comprising the steps of the optical assembly receiving the first pattern beam and the third pattern beam through the first optical inlet, and the optical assembly receiving the second pattern beam through the second optical inlet.

27. The method of claim 25 further comprising the step of controlling the first mask stage assembly, the second mask stage assembly, the third mask stage assembly, the illumination system, and the substrate stage assembly with a control system so that the first mask pattern is transferred to the first site, the second mask pattern is transferred to the second site, and the third mask pattern is transferred to a third site while the substrate is being moved at a substantially constant velocity along the scan axis.

28. The method of claim 15 wherein the optical assembly has a numerical aperture of 1.35.

29. The method of claim 15 wherein the used field has a second field dimension that is approximately five millimeters.

30. The exposure apparatus of claim 1 wherein the optical assembly has a numerical aperture of 1.35.

31. The exposure apparatus of claim 1 wherein the used field has a second field dimension that is approximately five millimeters.

32. An exposure apparatus for transferring a first mask pattern from a first mask and a second mask pattern from a second mask to a substrate, the substrate including a first site and a second site that are aligned along a scan axis, the exposure apparatus comprising:
   a first mask stage assembly that positions the first mask;
   a second mask stage assembly that positions the second mask;
   an illumination system that selectively generates a first illumination beam that is directed at the first mask to generate a first pattern beam, and a second illumination beam that is directed at the second mask to generate a second pattern beam;
   a substrate stage assembly that positions the substrate; and
   a catadioptric optical assembly that directs the first pattern beam and the second pattern beam at the substrate, the optical assembly including (i) a first optical inlet that receives the first pattern beam; (ii) a spaced apart second optical inlet that receives the second pattern beam; (iii) an optical outlet that directs both the first pattern beam and the second pattern beam at the substrate; (iv) a field of view that defines a first used field and a spaced apart second used field, the first pattern beam exiting the optical outlet at the first used field, the second pattern beam exiting the optical outlet at the second used field, wherein the first used field has a first field dimension that is at least approximately thirty-three millimeters and a second field dimension that is approximately five millimeters; and (v) a numerical aperture of at least approximately 1.30.

\* \* \* \* \*